(12) United States Patent
Kajiya

(10) Patent No.: US 10,919,184 B2
(45) Date of Patent: Feb. 16, 2021

(54) MASTER MANUFACTURING METHOD, OPTICAL BODY, OPTICAL MEMBER, AND DISPLAY DEVICE

(71) Applicant: DEXERIALS CORPORATION, Tokyo (JP)

(72) Inventor: Shunichi Kajiya, Tokyo (JP)

(73) Assignee: DEXERIALS CORPORATION, Tokyo (JP)

( * ) Notice: Subject to any disclaimer, the term of this patent is extended or adjusted under 35 U.S.C. 154(b) by 577 days.

(21) Appl. No.: 15/551,339

(22) PCT Filed: Mar. 29, 2016

(86) PCT No.: PCT/JP2016/060072
§ 371 (c)(1),
(2) Date: Aug. 16, 2017

(87) PCT Pub. No.: WO2016/158931
PCT Pub. Date: Oct. 6, 2016

(65) Prior Publication Data
US 2018/0029251 A1    Feb. 1, 2018

(30) Foreign Application Priority Data

Mar. 31, 2015    (JP) .................................. 2015-071845

(51) Int. Cl.
*B29C 33/38*    (2006.01)
*G02B 1/111*    (2015.01)
(Continued)

(52) U.S. Cl.
CPC .......... *B29C 33/3842* (2013.01); *B29C 33/38* (2013.01); *B29D 11/00288* (2013.01);
(Continued)

(58) Field of Classification Search
CPC ......... G02B 1/111; G02B 1/118; B29C 33/38; B29C 33/3842; B29D 11/00288; G03F 7/70025
(Continued)

(56) References Cited

U.S. PATENT DOCUMENTS

2010/0238548 A1\* 9/2010 Watanabe ......... G02F 1/133502
359/488.01
2011/0003121 A1    1/2011 Tsuda
(Continued)

FOREIGN PATENT DOCUMENTS

| JP | 2009-128539 | 6/2009 |
|---|---|---|
| JP | 2009-128541 | 6/2009 |

(Continued)

OTHER PUBLICATIONS

Nov. 20, 2018, Japanese Office Action issued for related JP application No. 2015-071845.
(Continued)

*Primary Examiner* — Binh X Tran
(74) *Attorney, Agent, or Firm* — Paratus Law Group, PLLC

(57) ABSTRACT

There is provided a master, an optical body, and a master manufacturing method, including: forming, on a surface of a master body that includes a base material, a periodic micro concave-convex structure in which an average cycle of concavities and convexities is less than or equal to visible light wavelengths; forming an inorganic resist layer on the surface of the master body; microparticulating and spraying an organic resist dissolved in a diluent onto the inorganic resist layer, to thereby form an organic resist layer, on a surface of which is provided a macro concave-convex structure in which the average cycle of concavities and convexities is greater than the visible light wavelengths; and
(Continued)

etching the organic resist layer, the inorganic resist layer, and the master body, to thereby superimpose and uniformly form the micro concave-convex structure and the macro concave-convex structure on the surface of the base material.

13 Claims, 18 Drawing Sheets

(51) Int. Cl.
  *B29D 11/00* (2006.01)
  *B41M 5/36* (2006.01)
  *G02B 1/118* (2015.01)
  *G02B 5/02* (2006.01)
  *G03F 7/20* (2006.01)
  *B29C 59/04* (2006.01)
  *B29L 11/00* (2006.01)
(52) U.S. Cl.
  CPC ............... *B41M 5/36* (2013.01); *G02B 1/111* (2013.01); *G02B 1/118* (2013.01); *G02B 5/0268* (2013.01); *G03F 7/70025* (2013.01); *B29C 59/04* (2013.01); *B29D 11/00788* (2013.01); *B29K 2995/0024* (2013.01); *B29L 2011/00* (2013.01); *G02B 5/0215* (2013.01)
(58) Field of Classification Search
  USPC ..................................................... 216/24, 26
  See application file for complete search history.

(56) References Cited

U.S. PATENT DOCUMENTS

| | | | |
|---|---|---|---|
| 2011/0100827 A1 | 5/2011 | Hayashi et al. | |
| 2012/0275027 A1* | 11/2012 | Okuno | G02B 1/115 359/601 |
| 2013/0121018 A1* | 5/2013 | Sasaki | G02B 5/0221 362/602 |
| 2014/0295145 A1* | 10/2014 | Mizuno | B32B 3/263 428/172 |
| 2015/0060289 A1* | 3/2015 | Saiki | G02B 1/111 205/50 |
| 2015/0060840 A1* | 3/2015 | Nishimura | H01L 51/5206 257/40 |
| 2015/0221824 A1* | 8/2015 | Hatta | H01L 21/02521 257/98 |
| 2016/0052227 A1* | 2/2016 | Takihara | B32B 27/304 428/141 |

FOREIGN PATENT DOCUMENTS

| | | |
|---|---|---|
| JP | 2009-128543 | 6/2009 |
| JP | 2009-288337 | 12/2009 |
| JP | 2010-092936 | 4/2010 |
| JP | 2011-026648 | 2/2011 |
| JP | 2012-001000 | 1/2012 |
| JP | 4916597 B2 | 2/2012 |
| JP | 2014-043068 | 3/2014 |
| WO | WO2009/144970 A1 | 12/2009 |
| WO | WO2009/147858 A1 | 12/2009 |

OTHER PUBLICATIONS

Dec. 20, 2018, Korean Office Action issued for related KR application No. 10-2017-7026724.

Minoru Sasaki et al.(Tohoku Univ.), Lithography on optical fiber using resist spraying method, 31p-W-1, Mar. 28-31, 2000, p. 996, Report on the 47th Spring Meeting of the Japan Society of Applied Physics and Related Societies, Aoyama Gakuin University, Tokyo, JP.

* cited by examiner

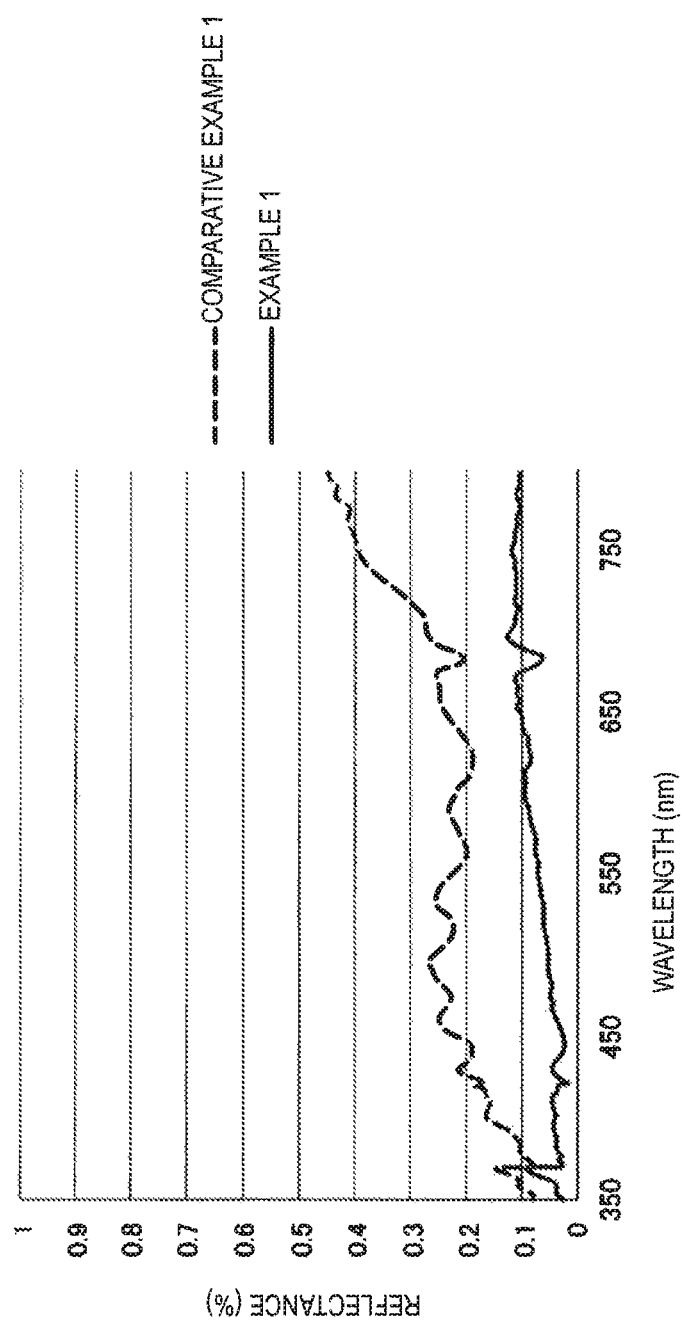

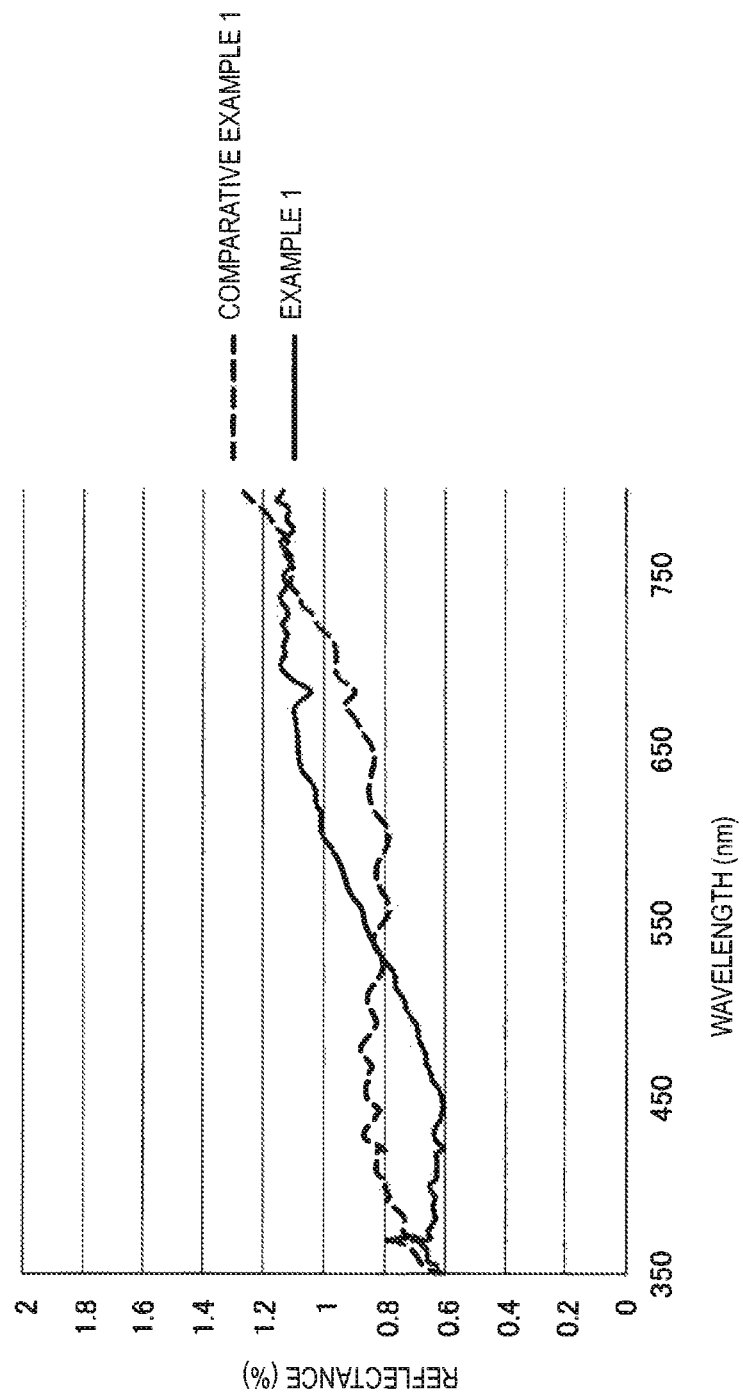

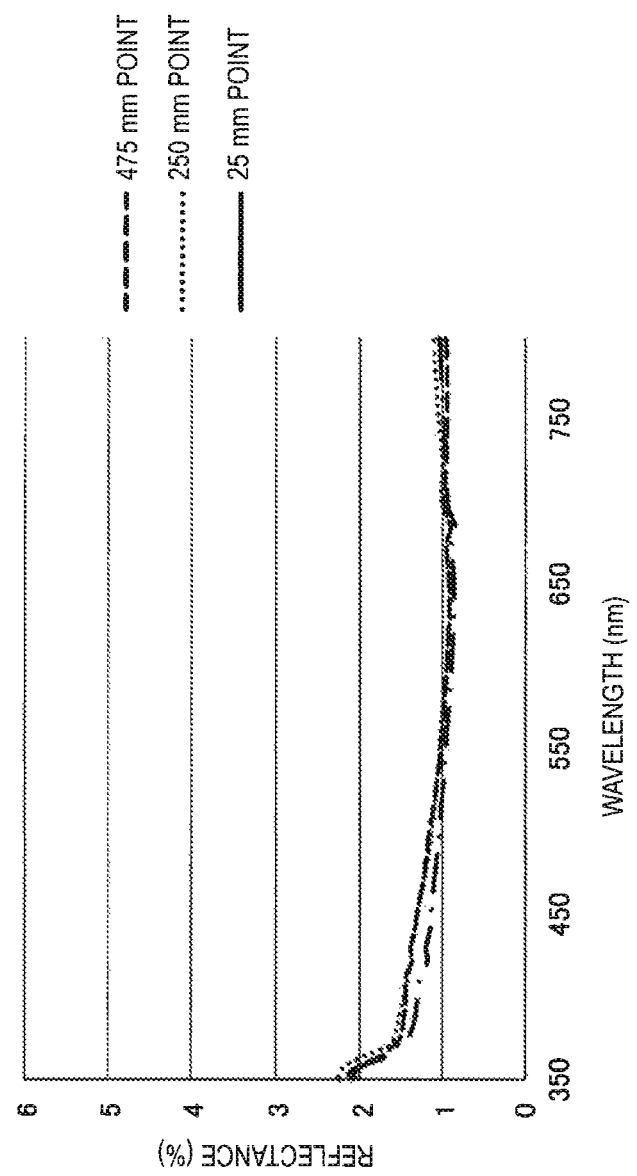

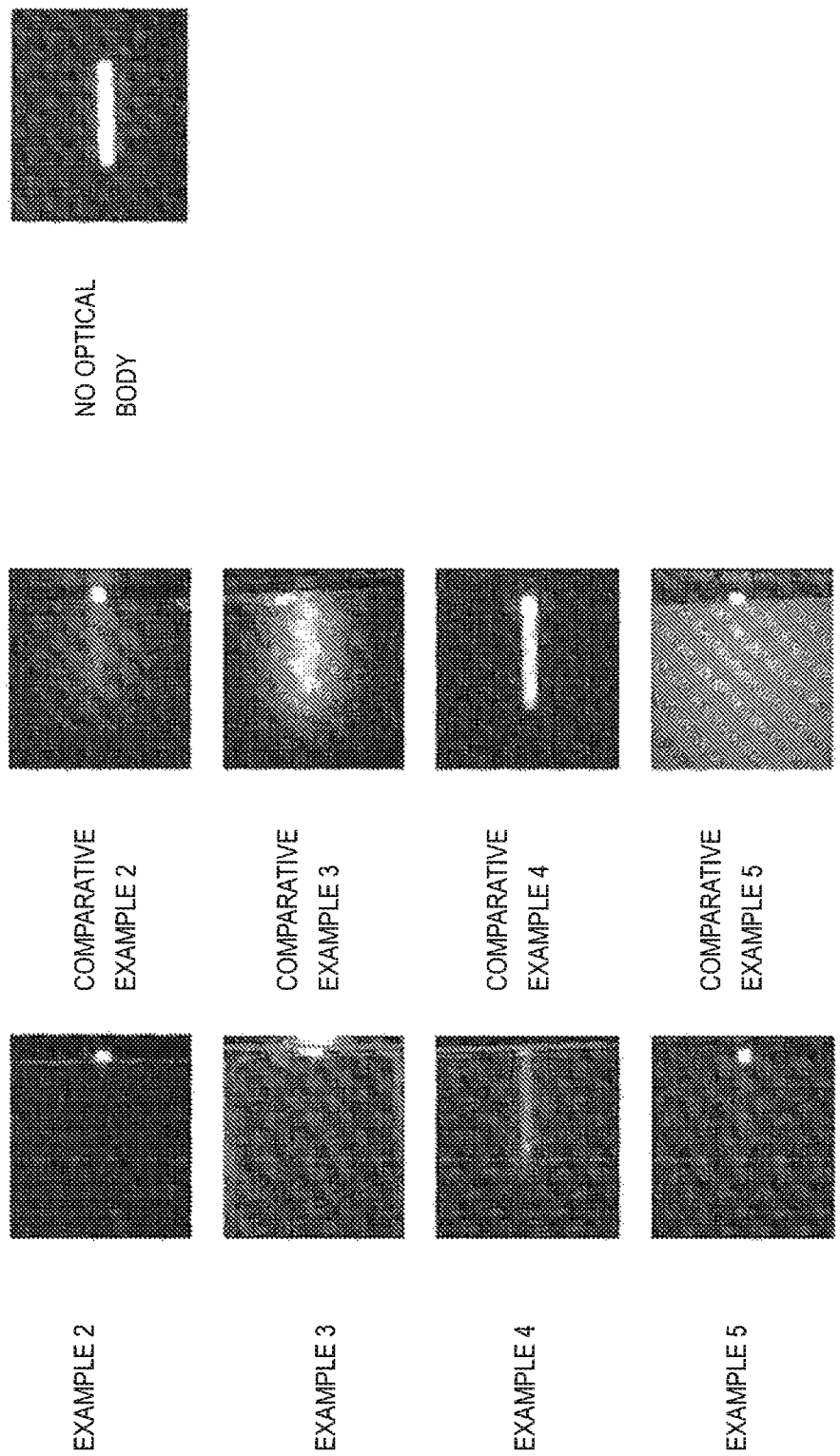

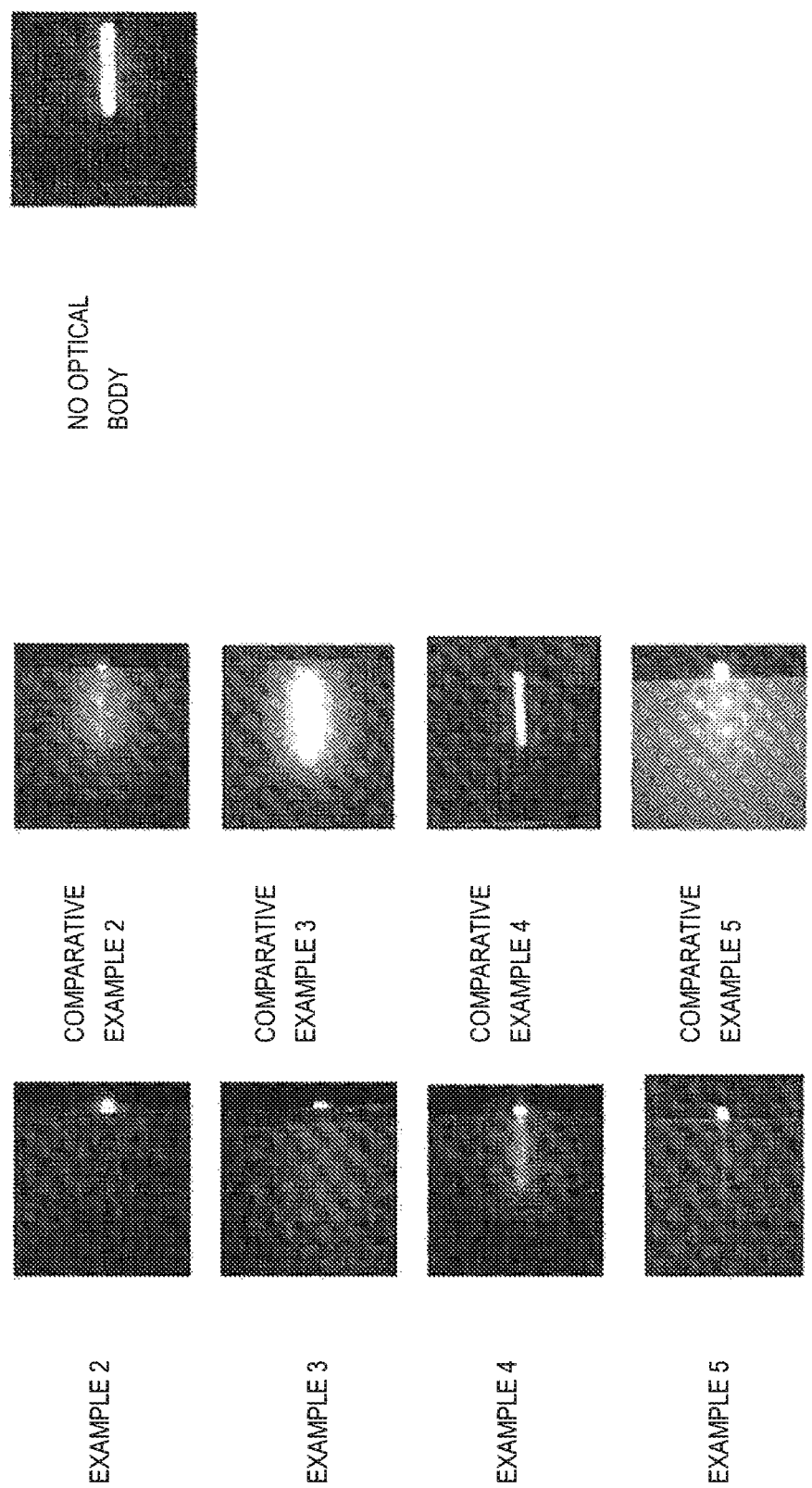

MASTER MANUFACTURING METHOD, OPTICAL BODY, OPTICAL MEMBER, AND DISPLAY DEVICE

CROSS REFERENCE TO PRIOR APPLICATION

This application is a National Stage Patent Application of PCT International Patent Application No. PCT/JP2016/060072 (filed on Mar. 29, 2016) under 35 U.S.C. §371, which claims priority to Japanese Patent Application No. 2015-071845 (filed on Mar. 31, 2015), which are all hereby incorporated by reference in their entirety.

TECHNICAL FIELD

The present invention relates to a master manufacturing method, an optical body, an optical member, and a display device.

BACKGROUND ART

Typically, with display devices such as televisions, and optical elements such as camera lenses, in order to reduce surface reflections and increase transmitted light, an anti-reflection treatment is performed on the light-incident surface. For example, one proposal for such an anti-reflection treatment is to laminate, onto the light-incident surface, an optical body on which is formed a micro concave-convex structure in which the average cycle of the concavities and convexities is less than or equal to the visible light wavelengths (such as a moth-eye structure, for example).

On a surface having such a micro concave-convex structure, since the refractive index changes gently with respect to incident light, sudden changes in the refractive index which can cause reflections are not produced. Consequently, by forming such a micro concave-convex structure on the surface of the light-incident face, reflections of incident light can be prevented over a wide wavelength range.

Regarding the method of forming a micro concave-convex structure in which the average cycle of concavities and convexities is on the order of nanometers, for example, Patent Literature 1 discloses a method of performing dry etching by using island-shaped nanoparticles as a protective mask. Also, Patent Literature 2 and 3 disclose methods of using the anodic oxidation of an aluminum film to form a micro concave-convex structure having multiple sub-micrometer concavities in the aluminum film. Furthermore, Patent Literature 4 discloses a method of using electron-beam lithography to form a micro concave-convex structure in which the average cycle of the concavities and convexities is less than or equal to a certain wavelength.

In addition, Patent Literature 1 and 2 disclose that it is also possible to form a transfer product to which the micro concave-convex structure has been transferred by pressing a structure on which has been formed such a micro concave-convex structure into a resin or the like.

Note that regarding a method of forming a transfer product to which the micro concave-convex structure has been transferred by using a structure on which has been formed the micro concave-convex structure as an original pattern, the technology disclosed in Patent Literature 5 below is also known. Specifically, the technology disclosed in Patent Literature 5 presses a roll-shaped mold, on the outer circumferential surface of which a fine pattern has been formed, into a film or the like while also rotating the mold, to thereby transfer the fine pattern onto a film of large surface area.

Herein, with the structures disclosed in Patent Literature 2 to 4, the micro concave-convex structure is superimposed and formed on a substrate on which has been formed, mechanically or chemically, a macro concave-convex structure in which the average cycle of the concavities and convexities is greater than visible light wavelengths. Since such a macro concave-convex structure scatters light incident on the substrate, with the structures disclosed in Patent Literature 2 to 4, anti-glare properties additionally can be conferred to the micro concave-convex structure, and the anti-reflection characteristics can be improved further.

CITATION LIST

Patent Literature

Patent Literature 1: JP 2012-1000A
Patent Literature 2: JP 4916597B
Patent Literature 3: JP 2009-288337A
Patent Literature 4: JP 2009-128541A
Patent Literature 5: JP 2014-43068A

SUMMARY OF INVENTION

Technical Problem

However, with the structures disclosed in Patent Literature 2 to 4, since the micro concave-convex structure is superimposed and formed on the substrate on which is formed the macro concave-convex structure, the in-plane uniformity of the micro concave-convex structure is low.

On the other hand, there has also been investigation into forming, on a substrate on which is formed the micro concave-convex structure, an organic layer so as to embed the micro concave-convex structure, and after forming the macro concave-convex structure onto the organic layer, etching the substrate by using as a mask the organic layer on which is formed the macro concave-convex structure. In such a case, the macro concave-convex structure can be superimposed and formed on the micro concave-convex structure, but since the film thickness of the organic layer becomes excessive and variations in the film thickness tend to be produced, it is difficult to uniformly superimpose and form the macro concave-convex structure on the micro concave-convex structure by etching.

Accordingly, the present invention has been devised in light of the above problem, and an objective of the present invention is to provide a method of manufacturing a master in which a macro concave-convex structure and a micro concave-convex structure are superimposed and formed uniformly, an optical body manufactured with the master, an optical member provided with the optical body, and a display device provided with the optical body.

Solution to Problem

According to an aspect of the present invention in order to achieve the above object, there is provided a master manufacturing method, including: a step of forming, on a surface of a master body that includes a base material, a periodic micro concave-convex structure in which an average cycle of concavities and convexities is less than or equal to visible light wavelengths; a step of forming an inorganic resist layer on the surface of the master body; a step of microparticulating and spraying an organic resist dissolved in a diluent onto the inorganic resist layer, to thereby form an organic resist layer, on a surface of which is provided a macro concave-convex structure in which the average cycle of concavities and convexities is greater than the visible light wavelengths; and a step of etching the organic resist layer, the inorganic resist layer, and the master body, to thereby superimpose and form the micro concave-convex structure and the macro concave-convex structure on the surface of the base material.

The diluent may include a solvent that volatilizes during spraying.

The solvent that volatilizes during spraying may be included 50% by mass or greater with respect to a total mass of the diluent.

An etching of the inorganic resist layer using as a mask the organic resist layer, and an etching of the base material using as a mask the inorganic resist layer, may be conducted by dry etching using different gases.

The dry etching may be vertically anisotropic etching using a gas that at least includes fluorine atoms, and includes at least two or more from among carbon atoms, fluorine atoms, oxygen atoms, and hydrogen atoms.

The micro concave-convex structure may be formed by thermal reaction lithography with a laser.

The master body may be made up of the base material, and a base material resist layer formed on the surface of the base material. The micro concave-convex structure may be formed in the base material resist layer. The inorganic resist layer may be formed on the base material resist layer so as to embed the micro concave-convex structure. The base material resist layer may be etched at a same time as the inorganic resist layer.

An etch rate of the base material resist layer may be different from an etch rate of the inorganic resist layer.

The master body may be made up of the base material. The micro concave-convex structure may be formed in the base material.

According to another aspect of the present invention in order to achieve the above object, there is provided an optical body, in which the micro concave-convex structure and the macro concave-convex structure formed on the surface of the master is transferred to a resin base material, using the master manufactured by the manufacturing method.

A haze value of the optical body may be 20% or greater.

According to another aspect of the present invention in order to achieve the above object, there is provided an optical member, in which the optical body is laminated onto a substrate surface.

According to another aspect of the present invention in order to achieve the above object, there is provided a display device, in which the optical body is laminated onto a display screen.

Furthermore, according to another aspect of the present invention in order to achieve the above object, there is provided a display device, including: an optical body provided with a macro concave-convex structure formed on a surface of a resin base material, in which an average cycle of concavities and convexities is greater than visible light wavelengths, and a periodic micro concave-convex structure formed superimposed on the macro concave-convex structure, in which the average cycle of concavities and convexities is less than or equal to the visible light wavelengths, the optical body having a haze value of 20% or greater; and a display panel in which the optical body is laminated onto a display screen.

According to the present invention, the organic resist layer on which is formed the macro concave-convex structure can be formed in a thinner film, and thus etching variations can be moderated.

Advantageous Effects of Invention

According to the present invention as described above, a master in which a macro concave-convex structure and a micro concave-convex structure are superimposed and formed uniformly can be manufactured. Also, by using such a master, an optical body in which a macro concave-convex structure and a micro concave-convex structure are superimposed uniformly can be manufactured.

BRIEF DESCRIPTION OF DRAWINGS

FIG. 16A is a graph illustrating the results of specular reflection spectrometry of optical bodies according to Example 1 and Comparative Example 1.

FIG. 16B is a graph illustrating the results of diffuse reflection spectrometry of optical bodies according to Example 1 and Comparative Example 1.

FIG. 17 is a graph illustrating the results of diffuse reflection spectrometry of optical bodies manufactured at different positions on the master according to Example 1.

FIG. 19 is captured images of the reflected images of a fluorescent light on a display panel to which an optical body has been applied.

FIG. 20 is captured images of the reflected images of a fluorescent light on a display device to which an optical body has been applied.

DESCRIPTION OF EMBODIMENTS

Figure 1:
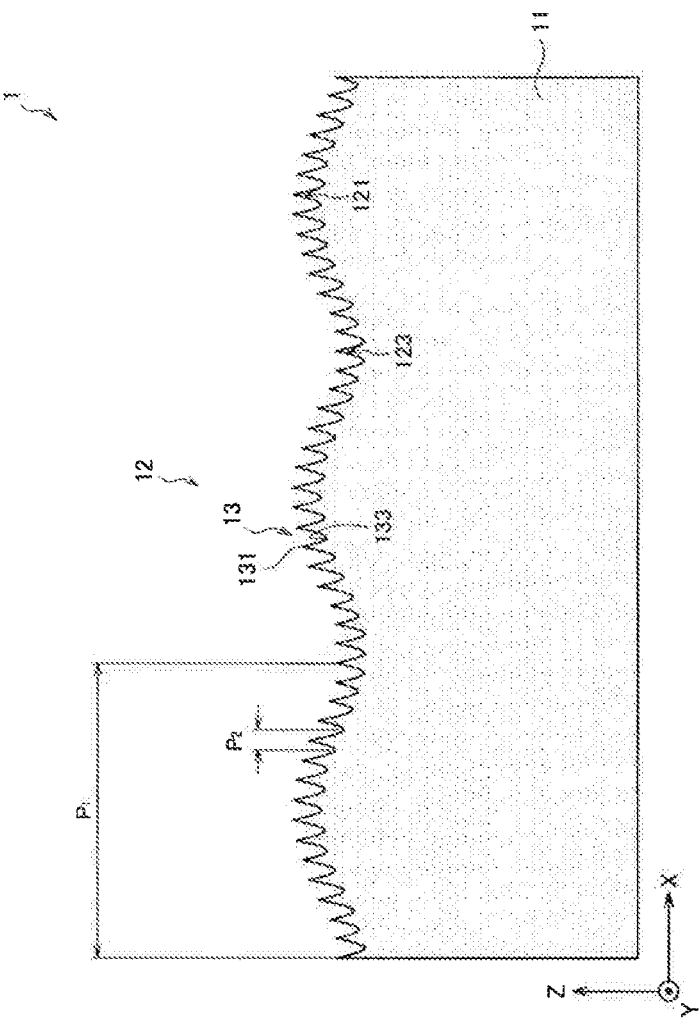
FIG. 1 is a cross-section diagram schematically illustrating the cross-sectional shape when cutting a master according to an embodiment of the present invention in the thickness direction.

Hereinafter, (a) preferred embodiment(s) of the present invention will be described in detail with reference to the appended drawings. In this specification and the appended drawings, structural elements that have substantially the same function and structure are denoted with the same reference numerals, and repeated explanation of these structural elements is omitted.

<1. Master>
[1.1. Structure of Master]

Figure 2:
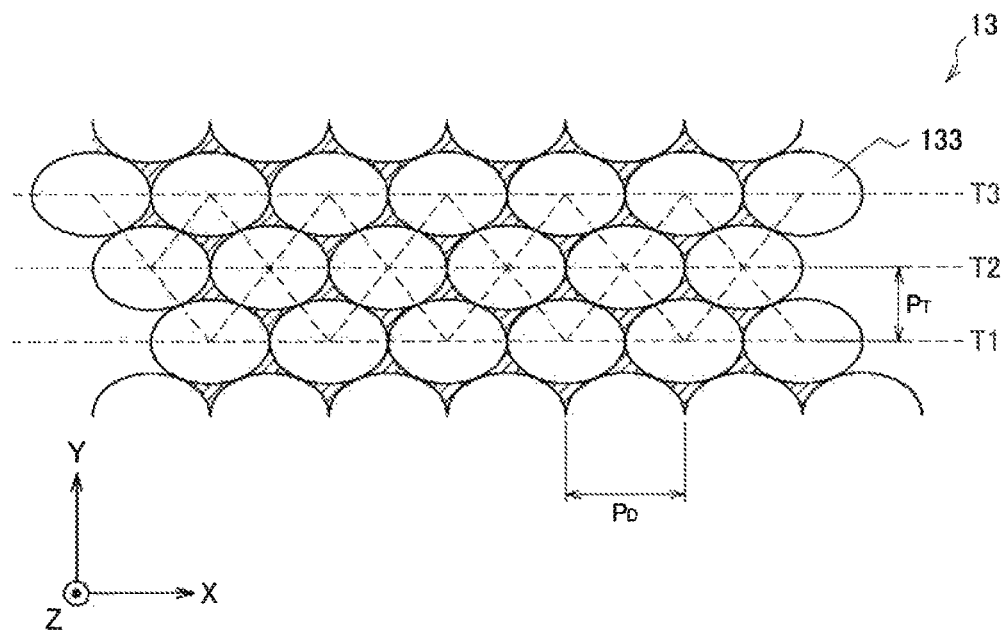
FIG. 2 is a top view illustrating an example of the planar arrangement of a master according to the embodiment.

First, the structure of a master manufactured by a manufacturing method according to an embodiment of the present invention will be described with reference to FIGS. 1 and 2. FIG. 1 is a cross-section diagram schematically illustrating the cross-sectional shape when cutting a master 1 according to the present embodiment in the thickness direction. Also, FIG. 2 is a top view illustrating an example of the planar arrangement of the master 1 according to the present embodiment.

The master 1 according to the present embodiment is a master for the nanoimprint method, for example. By using such a master 1 to transfer a concave-convex structure formed on the surface of the master 1 to a resin base material or the like, a transfer product to which the concave-convex structure has been transferred can be manufactured with high production efficiency. Note that the transfer product onto which the concave-convex structure is transferred by the master 1 according to the present embodiment is used as an optical body, such as an anti-reflection film, for example.

As illustrated in FIG. 1, the master 1 according to the present embodiment is provided with a macro concave-convex structure 12 formed on the surface of a base material 11, and a micro concave-convex structure 13 superimposed onto the macro concave-convex structure 12.

The base material 11 is a glass member, for example, and specifically is formed from quartz glass. However, the base material 11 is not particularly limited insofar as the $SiO_2$ purity is high, and may also be formed from a material such as fused quartz glass or synthetic quartz glass. Note that the shape of the base material 11 is not particularly limited, and may be a planar shape, and may also be a round columnar shape or a hollow round cylindrical shape, for example.

The macro concave-convex structure 12 is a concave-convex structure formed on the base material 11. As illustrated in FIG. 1, the macro concave-convex structure 12 includes valleys 123, which are concavities in the thickness direction of the base material 11, and peaks 121, which are convexities in the thickness direction of the base material 11. The average cycle of the concavities and convexities of the macro concave-convex structure 12 is greater than the visible light wavelengths (for example, exceeding 830 nm), and preferably more than or equal to 1 μm and less than or equal to 100 μm. Herein, the average cycle of the concavities and convexities in the macro concave-convex structure 12 corresponds to the average distance P1 between adjacent valleys 123 and 123, or between adjacent peaks 121 and 121, as illustrated in FIG. 1. More specifically, the macro concave-convex structure 12 may be an anti-glare structure in which the average cycle of the concavities and convexities is more than or equal to 1 μm and less than or equal to 100 μm.

The micro concave-convex structure 13 is a concave-convex structure superimposed and formed onto the macro concave-convex structure 12, and as illustrated in FIG. 1, includes concavities 133 which are concave in the thickness direction of the base material 11, and convexities 131 which are positioned in between adjacent concavities 133 and 133. The average cycle of the concavities and convexities of the micro concave-convex structure 13 is less than or equal to the visible light wavelengths (for example, less than or equal to 830 nm), preferably more than or equal to 100 nm and less than or equal to 350 nm. Herein, the average cycle of the concavities and convexities in the micro concave-convex structure 13 corresponds to the average distance P2 between the vertices of adjacent convexities 131 and 131, or between the centers of the bases of adjacent concavities 133 and 133, as illustrated in FIG. 1. More specifically, the micro concave-convex structure 13 may be a moth-eye structure in which the convexities 131 or the concavities 133 are two-dimensionally arranged periodically on the XY plane of the base material 11.

Next, an example of the two-dimensional arrangement of the micro concave-convex structure 13 on the XY plane will be described with reference to FIG. 2. Note that although the following illustrates an example in which the concavities 133 of the micro concave-convex structure 13 are two-dimensionally arranged, the present invention is not limited to such an example. For example, the micro concave-convex structure 13 may also be a structure in which the convexities 131 instead of the concavities 133 are two-dimensionally arranged as described below.

As illustrated in FIG. 2, the micro concave-convex structure 13 formed on the surface of the master 1 according to the present embodiment is arranged so that the center-to-center interval between adjacent concavities 133 is less than or equal to the visible light wavelengths. Specifically, the concavities 133 are arranged so that the arrangement interval (dot pitch) $P_D$ of the concavities 133 in each track (the rows in the X direction in FIG. 2) is less than or equal to the visible light wavelengths. Also, the arrangement interval (track pitch) $P_T$ of tracks of the concavities 133 is arranged so that the interval between the centers of adjacent concavities 133 is less than or equal to the visible light wavelengths.

For example, the dot pitch $P_D$ and the track pitch $P_T$ each may be more than or equal to 100 nm and less than or equal to 350 nm, and more preferably, each may be more than or equal to 150 nm and less than or equal to 280 nm. At this point, in the case in which either of the dot pitch $P_D$ and the track pitch $P_T$ is less than 100 nm, formation of the micro concave-convex structure 13 becomes difficult, which is not preferable. Also, in the case in which either of the dot pitch $P_D$ and the track pitch $P_T$ exceeds 350 nm, there is a possibility that a diffraction phenomenon of visible light may occur in an optical body formed with the master 1, which is not preferable. The lengths of the dot pitch $P_D$ and the track pitch $P_T$ may be equal to or different from each other.

Also, insofar as the two-dimensional arrangement on the XY plane is periodic, the micro concave-convex structure 13 formed on the surface of the master 1 according to the present embodiment is not limited to the arrangement illustrated in FIG. 2, and may be any type of arrangement. For example, the multiple rows of tracks in which the concavities 133 are arranged may be straight or curved. Also, in FIG. 2, the two-dimensional arrangement of the concavities 133 exhibits a staggered arrangement in which the arrangement pitch (dot pitch $P_D$) of the concavities 133 is offset by one-half the dot pitch in adjacent tracks, but the present invention is not limited to this example. For example, the two-dimensional arrangement of the concavities 133 may also be a rectangular (four-sided) lattice arrangement in which the concavities 133 are positioned at the vertices of a rectangle.

As described above, the master 1 according to the present embodiment has a structure in which the macro concave-convex structure 12 and the micro concave-convex structure 13 are formed superimposed. Consequently, an optical body to which has been transferred the concave-convex structure formed on the surface of the master 1 according to the present embodiment has a structure in which the macro concave-convex structure 12 and the micro concave-convex structure 13 are superimposed. With this arrangement, an optical body manufactured with the master 1 has both high anti-glare characteristics due to the macro concave-convex structure 12, and high anti-reflection characteristics due to the micro concave-convex structure 13.

[1.2. Master Manufacturing Method]

Next, a master manufacturing method according to the present embodiment described above will be described with reference to FIGS. 3 to 9. FIGS. 3 to 7A, FIG. 8, and FIG. 9 are cross-section diagrams explaining respective steps in a master manufacturing method according to the present embodiment. Meanwhile, FIG. 7B is a cross-section diagram explaining a step in a master manufacturing method according to a comparative example. Note that each step below may be performed by using typical known devices. Also, regarding the specific conditions for each step, since typical manufacturing conditions are applicable, a detailed description of numerical values and the like will be reduced or omitted.

Figure 3:
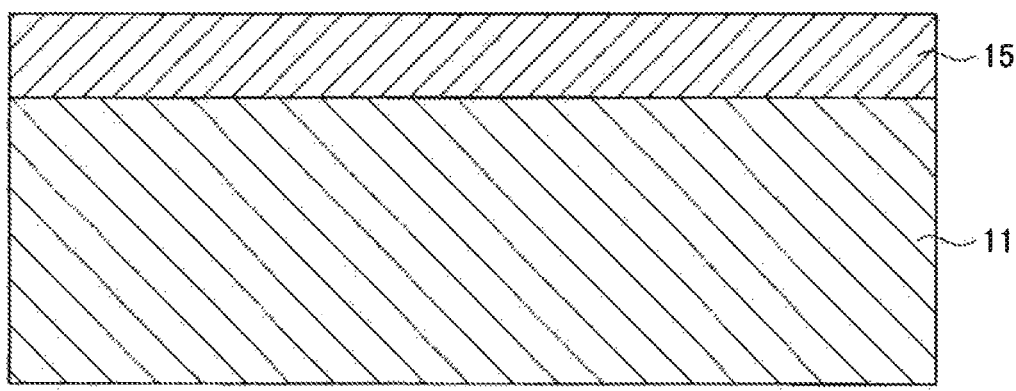
FIG. 3 is a cross-section diagram explaining a step in a master manufacturing method according to the embodiment.

First, as illustrated in FIG. 3, a base material resist layer 15 is formed in a film on a base material 11 such as cleaned quartz glass, for example. At this point, either an organic resist or an inorganic resist can be used for the base material resist layer 15. Materials such as a novolac-type resist or a chemically-amplified resist can be used as an organic resist, for example. Also, materials such as metallic oxides including one or multiple types of transition metals such as tungsten (W) or molybdenum (Mo) can be used as an inorganic resist, for example. However, to conduct thermal reaction lithography, the base material resist layer 15 preferably is formed with a thereto-reactive resist including a metallic oxide.

In the case of using an organic resist for the base material resist layer 15, the base material resist layer 15 can be formed in a film by using a process such as spin coating, slit coating, dip coating, spray coating, or screen printing. Also, in the case of using an inorganic resist for the base material resist layer 15, the base material resist layer 15 may be formed in a film by using a sputtering method. Note that a thickness more than or equal to 20 nm and less than or equal to 100 nm can be used as the thickness of the base material resist layer 15, for example.

Figure 4:
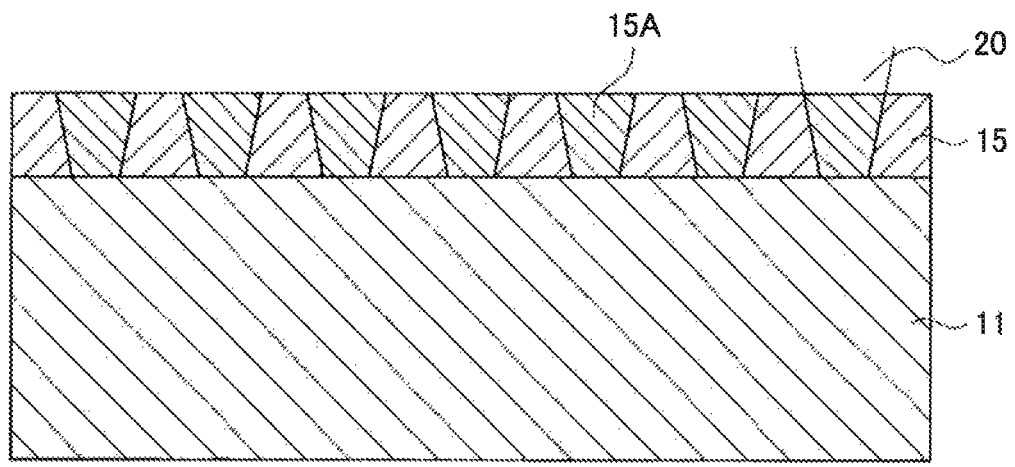
FIG. 4 is a cross-section diagram explaining a step in a master manufacturing method according to the embodiment.

Next, as illustrated in FIG. 4, the base material resist layer 15 is exposed by an exposure device, and a latent image 15A corresponding to the micro concave-convex structure 13 is formed in the base material resist layer 15. Specifically, in the case of conducting thermal reaction lithography, the exposure device modulates laser light 20, and irradiates the base material resist layer 15 with the laser light 20. With this arrangement, part of the base material resist layer 15 irradiated by the laser light 20 denatures due to thermal reaction, and thus a latent image 15A corresponding to the micro concave-convex structure 13 can be formed in the base material resist layer 15.

Figure 5:
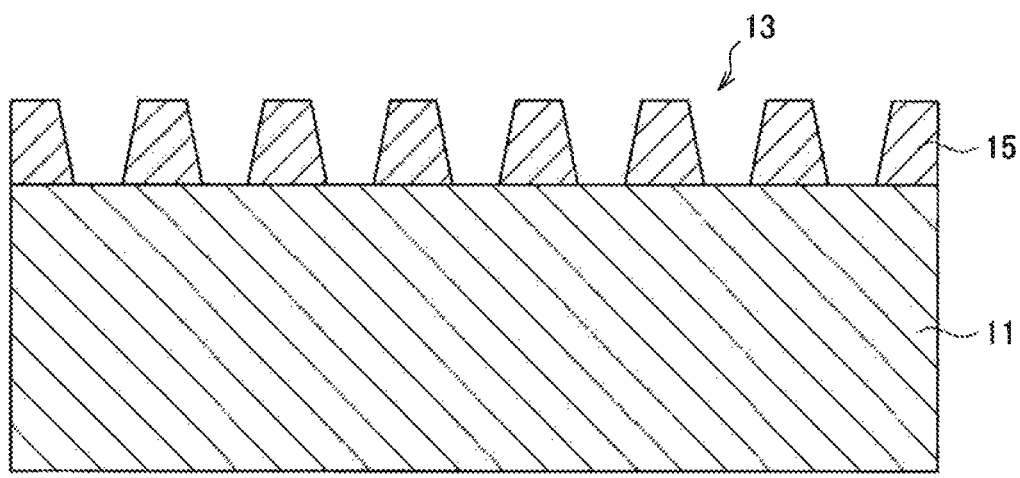
FIG. 5 is a cross-section diagram explaining a step in a master manufacturing method according to the embodiment.

Next, as illustrated in FIG. 5, by dripping a developer onto the base material resist layer 15 in which is formed the latent image 15A, the base material resist layer 15 is developed. Hence, the micro concave-convex structure 13 is formed in the base material resist layer 15. Note that, in the case in which the base material resist layer 15 is a positive resist, the exposed part which is exposed by the laser light 20 has an increased dissolution rate with respect to the developer compared to the unexposed part, and thus is removed by the developing process. Hence, a resist pattern in which the latent image 15A portion has been removed is formed in the base material resist layer 15. On the other hand, in the ease in which the base material resist layer 15 is a negative resist, the exposed part which is exposed by the laser light 20 has a lower dissolution rate with respect to the developer compared to the unexposed part, and thus the unexposed part is removed by the developing process. Hence, a resist pattern in which the latent image 15A portion still remains is formed in the base material resist layer 15.

Figure 6:
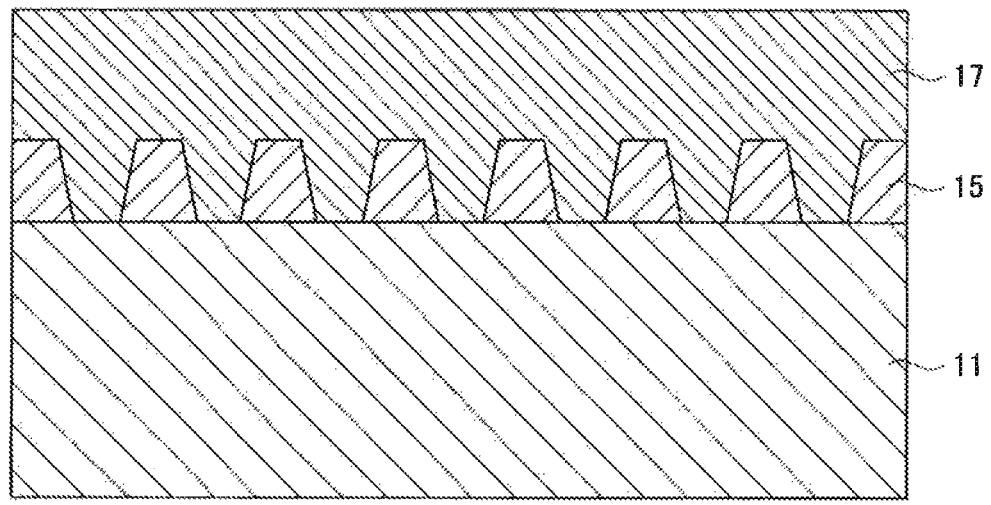
FIG. 6 is a cross-section diagram explaining a step in a master manufacturing method according to the embodiment.

Next, as illustrated in FIG. 6, an inorganic resist layer 17 is formed in a film on the base material resist layer 15, so as to embed the micro concave-convex structure 13. The inorganic resist layer 17 can be formed in a film by sputtering or the like, using a material such as, for example, $SiO_2$, Si, diamond-like carbon (DLC), a transition metal such as W or Mo, or a metallic oxide including one or multiple types of transition metals such as W and Mo. Note that a thickness more than or equal to 100 nm and less than or equal to 2000 nm can be used as the thickness of the inorganic resist layer 17, for example.

In the method of manufacturing the master 1 according to the present embodiment, in a step described later, the base material resist layer 15 in which is formed the micro concave-convex structure 13 is etched at the same time as the inorganic resist layer 17 formed in a film on the base material resist layer 15. For this reason, the material of the inorganic resist layer 17 preferably is selected to have a different etch rate than the base material resist layer 15. For example, in the case in which the base material resist layer 15 is a metallic oxide such as tungsten oxide, the inorganic resist layer 17 preferably is $SiO_2$, Si, DLC, or the like.

On the other hand, in the case in which the etch rate of the inorganic resist layer 17 and the etch rate of the base material resist layer 15 are the same, the inorganic resist layer 17 and the base material resist layer 15 are etched equally, and thus the micro concave-convex structure 13 formed in the base material resist layer 15 disappears. Consequently, to form the micro concave-convex structure 13 on the base material 11, the etch rate of the inorganic resist layer 17 preferably is different from the etch rate of the base material resist layer 15.

Figure 7A:
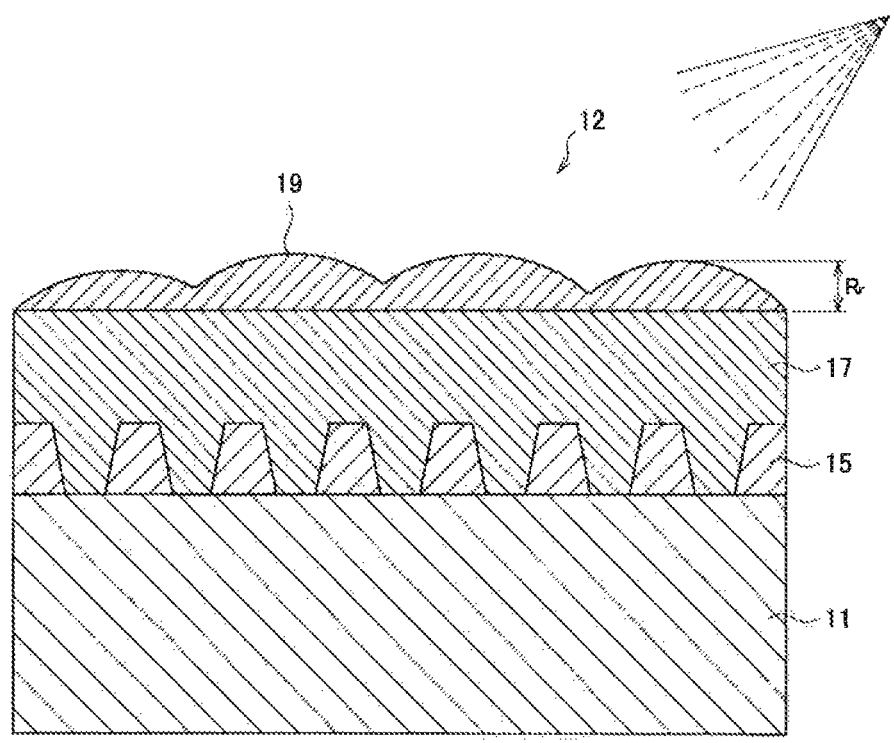
FIG. 7A is a cross-section diagram explaining a step in a master manufacturing method according to the embodiment.
Figure 7B:
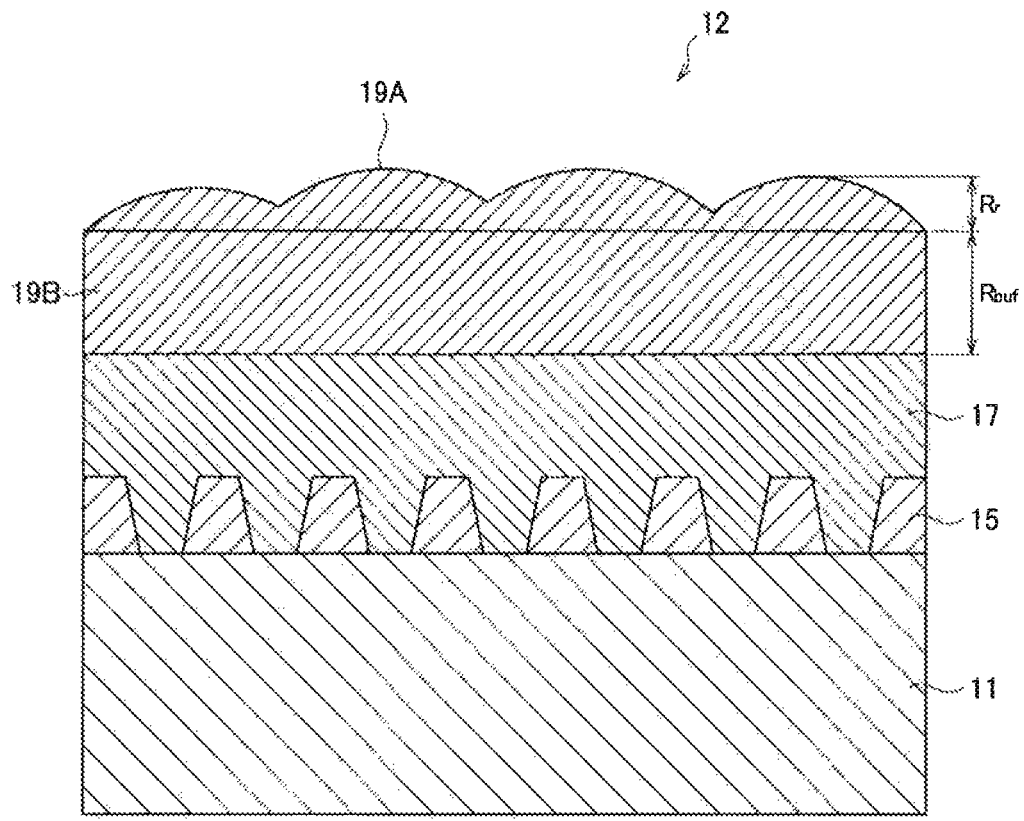
FIG. 7B is a cross-section diagram explaining a step in a master manufacturing method according to a comparative example.

Next, as illustrated in FIG. 7A, an organic resist layer 19, having on the surface a macro concave-convex structure 12 in which the average cycle of concavities and convexities is greater than the visible light wavelengths, is formed in a film on the inorganic resist layer 17. In the method of manufacturing the master 1 according to the present embodiment, the organic resist layer 19 is formed in a film by microparticulating and spraying an organic resist dissolved in a diluent.

At this point, as illustrated in FIG. 7B, in the case in which an organic resist layer 19A is formed uniformly in a film on the inorganic resist layer 17 by a coating method such as spin coating, for example, the macro concave-convex structure 12 is formed by a process such as the imprint transfer of a rough-surfaced film, or sandblasting. In such a case, a buffer resist layer 19B of thickness $R_{buf}$ that does not contribute to the formation of the macro concave-convex structure 12 is formed in the organic resist layer 19A. In the case in which the height of the macro concave-convex structure 12 (for example, the height difference between the vertices of the peaks and the base points of the valleys) is roughly 1 µm, the thickness of the buffer resist layer 19B becomes approximately from 2 µm to 3 µm, for example.

Such a buffer resist layer 19B occurs because an organic resist has some degree of viscosity, and forming the organic resist layer 19A in a film having no more than a fixed thickness is difficult. Also, the buffer resist layer 19B is required to have some degree of thickness so as not to damage the inorganic resist layer 17 underneath during the formation of the macro concave-convex structure 12.

In the case in which a thick buffer resist layer 19B exists as illustrated in FIG. 7B, differences in the etching progress are produced due to thickness variations in the buffer resist layer 19B. For this reason, with the method illustrated in FIG. 7B, conducting uniform etching of the inorganic resist layer 17 underneath is difficult. Also, in the case in which a thick buffer resist layer 19B exists, the longer etching time can sometimes cause the organic resist layer 19A and the inorganic resist layer 17 to denature due to heat and the like during etching. In such cases, the denatured organic resist layer 19A or inorganic resist layer 17 exhibits changed etching characteristics compared to before the denaturing, and thus consistent etching is difficult. Furthermore, large quantities of etching reaction products are produced by etching into the thick buffer resist layer 19B, and since these etching reaction products obstruct etching, the uniformity of etching is decreased.

On the other hand, with the method of manufacturing the master 1 according to the present embodiment, as illustrated in FIG. 7A, the organic resist layer 19 is formed in a film by microparticulating and spraying an organic resist dissolved in a diluent. In such a case, the organic resist layer 19 can be formed as an extremely thin film.

Specifically, by microparticulating and spraying a dilute organic resist, the microparticulated organic resist is deposited randomly on the inorganic resist layer 17, and an organic resist layer 19 having a macro concave-convex structure 12 based on the grain shapes of the microparticles of the organic resist is formed in a film. Hence, the thickness $R_t$ of the organic resist layer 19 can be made nearly the same as the height of the macro concave-convex structure 12 (for example, the height difference between the vertices of the peaks and the base points of the valleys), and thus the organic resist layer 19 can be given an extremely small thickness that does not contribute to the formation of the macro concave-convex structure 12.

The method of forming such an organic resist layer 19 illustrated in FIG. 7A will be described more specifically.

In the present embodiment, the organic resist that forms the organic resist layer 19 is dissolved in a diluent such as an organic solvent, and the dilute organic resist is sprayed with a spray coater or the like and formed in a film on the inorganic resist layer 17.

Note that any type of typical spray coater is usable as the spray coater used to spray the dilute organic resist. For example, a needle-type spray coater may be used to spray the dilute organic resist.

For the organic resist, any type of material is usable insofar as the material is an organic resin. For example, a novolac resin, an acrylic resin, or the like may be used. However, for the organic resist, it is more preferable to use an organic resin whose viscosity at 25° C. is 49 mPa·s or more, and it is even more preferable to use an organic resin whose viscosity at 25° C. is 115 mPa·s or more. Such an organic resist is highly viscous in the state before dilution, and thus in the case in which the diluent volatilizes during spraying, and the organic resist becomes gelled microparticles which fly towards and become deposited on an adherend, a three-dimensional concave-convex structure can be formed more easily. As such a highly viscous organic resist, for example, it is preferable to use an organic resist having a viscosity equal to or greater than P4210 (by AZ Chemical Inc.), a highly viscous acrylic multifunctional monomer, or the like.

The diluent is a solvent capable of dissolving the organic resist. Also, the diluent includes a solvent that volatilizes during spraying. Herein, a solvent that volatilizes during spraying specifically is a solvent having a low boiling point and high volatility. One example of a solvent that volatilizes during spraying is acetone, which has a vapor pressure of 24 kPa at 20° C., and a boiling point of 56.2° C. Also, other examples of solvents that volatilize during spraying include isopropyl alcohol, dimethyl ether, methyl acetate, and the like.

However, whether or not a solvent volatilizes during spraying also depends on factors such as the pressure and temperature inside the spray coater during spraying, and thus the solvent included in the diluent is not necessarily limited to the examples given above. The type of solvent that volatilizes during spraying which is included in the diluent may be selected appropriately by accounting for the pressure and temperature inside the spray coater during spraying.

In the case of spraying an organic resist diluted by a diluent including a solvent that volatilizes during spraying, since some of the solvent in the diluent volatilizes during spraying, the organic resist loses fluidity and becomes semi-gel-like microparticles. The microparticulated organic resist is deposited on the inorganic resist layer 17 in the semi-gel-like state, and thus does not spread out uniformly onto the inorganic resist layer 17, and solidifies while maintaining the particulate shape. By piling such an organic resist onto the inorganic resist layer 17, an organic resist layer 19 can be formed in a film in which the macro concave-convex structure 12 is formed on the surface thereof.

Note that the microparticles refer to particles having a grain size whereby the cycle of the concavities and convexities of the organic resist piled onto the inorganic resist layer 17 is more than or equal to 1 µm and less than or equal to 50 µm, and Rz (the ten-point mean roughness) is more than or equal to 1 µm and less than or equal to 5 µm, for example. In other words, microparticles refer to particles having a particle diameter roughly from 1 µm to 50 µm.

Herein, the ratio of the solvent that volatilizes during spraying which is included in the diluent preferably is equal to or greater than 50% by mass with respect to the total mass of the diluent. In a case in which the ratio of the solvent that volatilizes during spraying is less than 50% by mass, the amount of diluent that volatilizes during spraying becomes smaller, and thus the organic resist spreads out onto the inorganic resist layer 17 without becoming semi-gel-like microparticles, and there is a possibility that the macro concave-convex structure 12 may not be performed, which is not preferable. Also, the ratio of the solvent that volatilizes during spraying which is included in the diluent is more preferably more than or equal to 60% and less than or equal to 100% by mass, and even more preferably more than or equal to 75% and less than or equal to 100% by mass. In the case in which the ratio of the solvent that volatilizes during spraying of the diluent is within the above ranges, a more suitable macro concave-convex structure 12 can be formed on the surface of the organic resist layer 19.

Also, the organic resist preferably is diluted to a mass ratio of 1 part organic resist to more than or equal to 10 and less than or equal to 30 parts diluent (in other words, a dilution ratio more than or equal to 1:10 and less than or equal to 1:30 by mass ratio). In the case in which the dilution ratio of the organic resist exceeds 1:30, the ratio of organic resist becomes too small, and thus the deposited organic resist spreads out uniformly onto the inorganic resist layer 17, and the macro concave-convex structure 12 is no longer formed. Also, in the case in which the dilution ratio of the organic resist is less than 1:10, the ratio of organic resist becomes too large, and thus the viscosity of the dilute organic resist becomes too high, which makes spraying difficult. Note that the organic resist is diluted even more preferably to a dilution ratio of 1 part organic resist to more than or equal to 15 and less than or equal to 25 parts diluent.

Note that the average cycle of the concavities and convexities of the macro concave-convex structure 12 is controllable by factors such as the composition of the solution including organic resist to spray. For example, by increasing the dilution ratio of the organic resist by the diluent, it is possible to lengthen the average cycle of the concavities and convexities of the macro concave-convex structure 12. Also, by increasing the volatility and ratio of the solvent that volatilizes during spraying, it is possible to shorten the average cycle of the concavities and convexities of the macro concave-convex structure 12.

Figure 8:
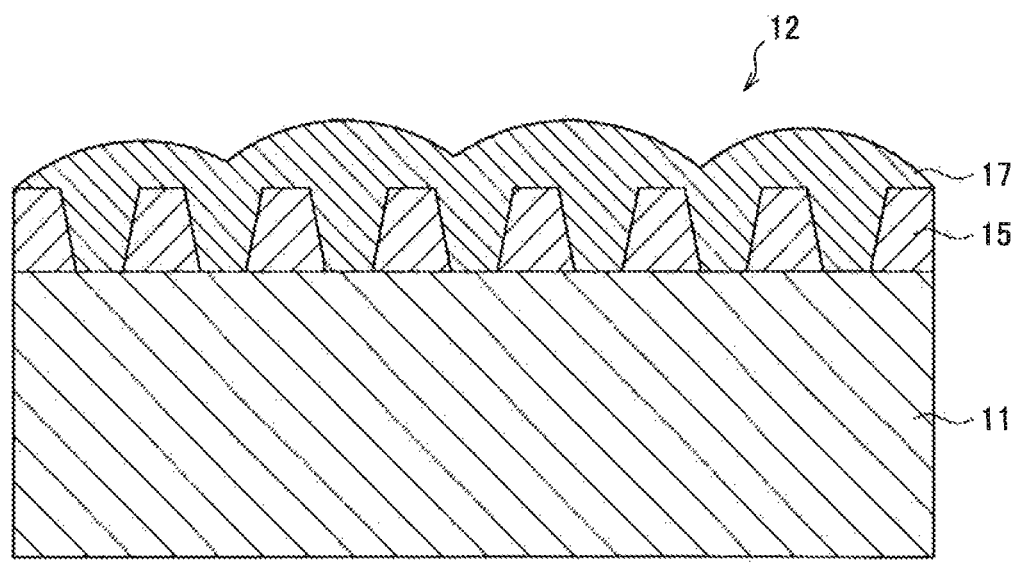
FIG. 8 is a cross-section diagram explaining a step in a master manufacturing method according to the embodiment.

Next, as illustrated in FIG. 8, the inorganic resist layer 17 is etched, using as a mask the organic resist layer 19 in which is formed the macro concave-convex structure 12. Hence, the macro concave-convex structure 12 is formed in the inorganic resist layer 17. The etching of the inorganic resist layer 17 in this step preferably uses dry etching that is vertically anisotropic. For example, the use of reactive ion etching (RIE) is preferable. On the other hand, in a case of using etching that is isotropic, such as wet etching, there is a possibility that the shape of the macro concave-convex structure 12 formed in the inorganic resist layer 17 may change greatly, which is not preferable.

Also, in the etching of the inorganic resist layer 17 using as a mask the organic resist layer 19, it is preferable to use an etching gas that at least includes fluorine atoms, and includes at least two or more from among carbon atoms, fluorine atoms, oxygen atoms, and hydrogen atoms. Specifically, it is possible to use a fluorocarbon gas such as $CHF_3$, $CH_2F_2$, $CF_4$, $C_2C_8$, or $C_3F_8$ as the etching gas. Additionally, it is also possible to add an additive gas such as $O_2$ gas, $H_2$ gas, or Ar gas to the above etching gas.

At this point, the height of the concavities and convexities of the macro concave-convex structure 12 formed in the inorganic resist layer 17 is controllable by the type and ratio of the etching gas. For example, by increasing the ratio of $O_2$ gas added to the etching gas, the height of the concavities and convexities of the macro concave-convex structure 12 formed in the inorganic resist layer 17 can be decreased. This is because in the case of increasing the ratio of $O_2$ gas in the etching gas, the etch rate of the organic resist layer 19 rises.

Note that in this step, after the etching of the inorganic resist layer 17, an $O_2$ ashing treatment or a sweeping treatment using an organic solvent may also be performed for the purpose of removing the remaining organic resist layer 19.

Also, the step of forming the organic resist layer 19 by spraying and the step of etching the inorganic resist layer 17 using as a mask the organic resist layer 19 described above may also be executed repeatedly until the desired macro concave-convex structure 12 is formed in the inorganic resist layer 17. By repeatedly executing the above steps, the height of the concavities and convexities of the macro concave-convex structure 12 formed in the inorganic resist layer 17 can be increased, and the average cycle of the concavities and convexities can be decreased further.

Figure 9:
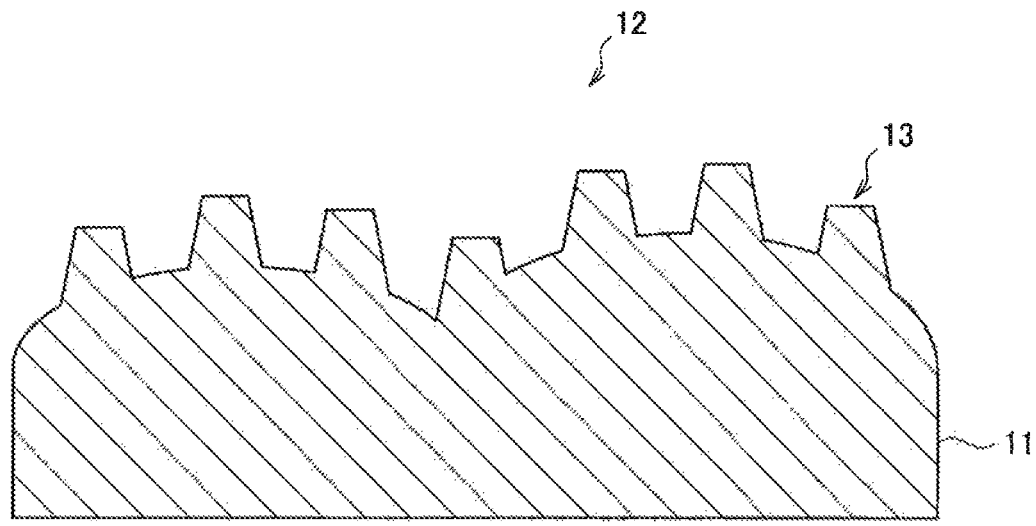
FIG. 9 is a cross-section diagram explaining a step in a master manufacturing method according to the embodiment.

Next, as illustrated in FIG. 9, the base material 11 is etched, using as a mask the inorganic resist layer 17 in which is formed the macro concave-convex structure 12, and the base material resist layer 15 in which is formed the micro concave-convex structure 13. Hence, the macro concave-convex structure 12 and the micro concave-convex structure 13 are formed superimposed on the base material 11. In the etching of the base material 11 in this step, similarly to the etching of the inorganic resist layer 17, it is preferable to use dry etching that is vertically anisotropic. For example, the use of reactive ion etching (RIE) is preferable. On the other hand, in the case of using etching that is isotropic, such as wet etching, there is a high likelihood of the micro concave-convex structure 13 not being formed in the base material 11, which is not preferable.

Also, in the etching of the base material 11 using as a mask the inorganic resist layer 17 and the base material resist layer 15, it is preferable to use an etching gas that at least includes fluorine atoms, and includes at least two or more from among carbon atoms, fluorine atoms, oxygen atoms, and hydrogen atoms. Specifically, it is possible to use a fluorocarbon gas such as $CHF_3$, $CF_4$, $C_2F_8$, or $C_3F_8$ as the etching gas. Additionally, it is also possible to add an additive gas such as $O_2$ gas, $H_2$ gas, or Ar gas to the above etching gas.

Note that different types of gases may also be used for the etching gas in the etching of the base material 11 using as a mask the inorganic resist layer 17 and the base material resist layer 15, and the etching gas in the etching of the inorganic resist layer 17 using as a mask the organic resist layer 19. This is because the etching conditions required to obtain a suitable etch rate ratio is often different between a step of etching an inorganic material (the inorganic resist layer 17) using as a mask an organic material (the organic resist layer 19), and a step of etching a material such as quartz glass (the base material 11) using as a mask a primarily inorganic material (the inorganic resist layer 17 and the base material resist layer 15).

At this point, the inorganic resist layer 17 in which is formed the macro concave-convex structure 12 is etched at the same time as the base material resist layer 15, and the macro concave-convex structure 12 formed in the inorganic resist layer 17 is formed in the base material 11. Also, the micro concave-convex structure 13 formed in the base material resist layer 15 is formed in the base material 11 in the following way.

Specifically, in the case in which the etch rate of the inorganic resist layer 17 is slower than the etch rate of the base material resist layer 15, the etching of the base material resist layer 15 progresses first, and the base material 11 contacting the base material resist layer 15 is exposed first. For this reason, the etching of the base material 11 progresses while using as a mask the inorganic resist layer 17 formed in the concavities of the micro concave-convex structure 13, and in the base material 11, there is formed a micro concave-convex structure 13 in which the positions of the concavities and convexities are the inverse of the micro concave-convex structure 13 formed in the base material resist layer 15.

Also, in the case in which the etch rate of the inorganic resist layer 17 is faster than the etch rate of the base material resist layer 15, the etching of the inorganic resist layer 17 progresses first, and the base material 11 contacting the inorganic resist layer 17 is exposed first. For this reason, the etching of the base material 11 progresses while using as a mask the base material resist layer 15 in which is formed the micro concave-convex structure 13, and in the base material 11, there is formed a micro concave-convex structure 13 in which the positions of the concavities and convexities are the same as the micro concave-convex structure 13 formed in the base material resist layer 15.

Note that in this step, a cleaning treatment for removing the remaining inorganic resist layer 17 and base material resist layer 15 additionally may be performed on the base material 11 in which the macro concave-convex structure 12 and the micro concave-convex structure 13 are formed superimposed.

By the above steps, a master 1 according to the present embodiment is manufactured. According to the master manufacturing method according to the present embodiment, an organic resist layer 19 in which is formed the macro concave-convex structure 12 can be formed in a thinner film, and thus etching variations and the like can be moderated, and the macro concave-convex structure 12 and the micro concave-convex structure 13 can be formed superimposed uniformly on the base material 11.

Note that the inorganic resist layer 17 may be formed in a single layer, but may also be formed in multiple layers. In the case in which the inorganic resist layer 17 is formed in multiple layers, the inorganic resist layer 17 preferably is formed by laminating together resists with different properties, such as DLC and $SiO_2$, DLC and a metallic oxide, or a metallic oxide and Si, for example. With this arrangement, the breadth of selection among etching conditions for the base material 11 can be broadened.

Also, the above indicates a method of forming the inorganic resist layer 17 in a film so as to embed the base material resist layer 15 in which is formed the micro concave-convex structure 13, and etching the inorganic resist layer 17 and the base material resist layer 15 at the same time, but the present invention is not limited to such an example. For example, the base material 11 may be etched first, using as a mask the base material resist layer 15 in which is formed the micro concave-convex structure 13, and after that, the inorganic resist layer 17 may be formed in a film on the base material 11 in which is formed the micro concave-convex structure 13. In such a case, the inorganic resist layer 17 may be formed in multiple layers, such as a DLC layer formed in a film on the base material 11, and a metallic oxide (for example, tungsten oxide) layer formed in a film on the DLC layer, for example.

However, in the case of etching the base material 11 first to form the micro concave-convex structure 13, the height of the concavities and convexities of the micro concave-convex structure 13 thrilled in the base material 11 becomes greater than the height of the concavities and convexities of the micro concave-convex structure 13 formed in the base material resist layer 15. For this reason, the increase in the aspect ratio of the micro concave-convex structure 13 formed on the base material 11 causes the coverage of the inorganic resist layer 17 to drop, and etching variations with respect to the inorganic resist layer 17 occur more readily, which is not preferable.

On the other hand, in the case of forming the inorganic resist layer 17 on the base material resist layer 15 in which is formed the micro concave-convex structure 13, the height of the concavities and convexities of the micro concave-convex structure 13 formed in the base material resist layer 15 is small, and the aspect ratio is also small. Consequently, the coverage of the inorganic resist layer 17 formed in a film on the base material resist layer 15 can be improved, and etching variations in the inorganic resist layer 17 can be moderated. In such a case, variations in the concave-convex structure formed on the base material 11 can be moderated, which is more preferable.

<2. Method of Manufacturing Optical Body Using Master>

Figure 10:
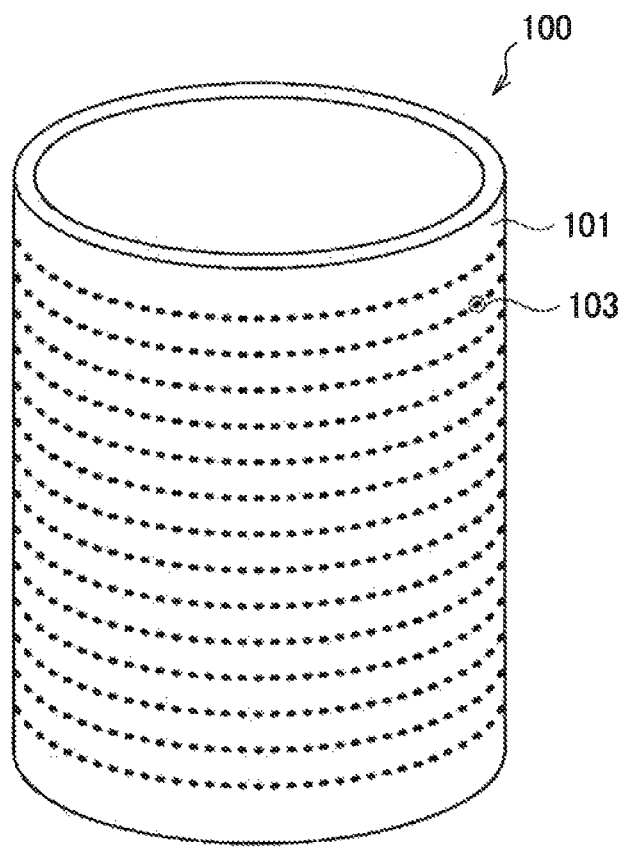
FIG. 10 is a perspective view illustrating a specific shape of a master according to the embodiment.

Next, an optical body manufactured using a master according to the present embodiment will be described with reference to FIGS. 10 to 12. FIG. 10 is a perspective view illustrating a specific shape of a master according to the present embodiment.

As illustrated in FIG. 10, a master according to the present embodiment is a hollow round cylindrical master 100, and is a roll-to-roll nanoimprint master made up of a base material 101 with a hollow round cylindrical shape in which a concave-convex structure 103 is formed on the outer circumferential surface, for example. By pressing such a hollow round cylindrical master 100 into a sheet-like resin base material while also rotating the hollow round cylindrical master 100, an optical body to which has been transferred the concave-convex structure 103 formed on the outer circumferential surface of the hollow round cylindrical master 100 can be manufactured continuously with high production efficiency.

The base material 101 is a member having a hollow round cylindrical shape, for example. However, the shape of the base material 101 may be hollow round cylindrical shape having an interior cavity as illustrated in FIG. 10, but may also be a solid round columnar shape not having an interior cavity. Also, the material of the base material 101 is not particularly limited, and quartz glass ($SiO_2$) such as fused quartz glass or synthetic quartz glass can be used. The size of the base material 101 is not particularly limited. For example, the length in the axial direction may be 100 mm or greater, the outer diameter may be more than or equal to 50 mm and less than or equal to 300 mm, and the thickness may be more than or equal to 2 mm and less than or equal to 50 mm.

The concave-convex structure 103 is a structure in which a periodic micro concave-convex structure having an average cycle of concavities and convexities that is less than or equal to the visible light wavelengths and a macro concave-convex structure having an average cycle of concavities and convexities that is greater than the visible light wavelengths are superimposed and formed. Herein, the macro concave-convex structure may be an anti-glare structure in which the average cycle of the concavities and convexities is more than or equal to 1 μm and less than or equal to 100 μm, for example. Meanwhile, the micro concave-convex structure may be a moth-eye structure in which the average cycle of the concavities and convexities is more than or equal to 100 μm and less than or equal to 350 nm, for example.

Such a hollow round cylindrical master 100 in which a concave-convex structure 103 is formed on the outer circumferential surface can be manufactured by the master manufacturing method described above, for example. Particularly, exposure of the hollow round cylindrical master 100 can be performed by using the exposure device described below with reference to FIG. 11. FIG. 11 is an explanatory diagram explaining an exposure device 200 used when exposing the hollow round cylindrical master 100 according to the present embodiment.

Figure 11:
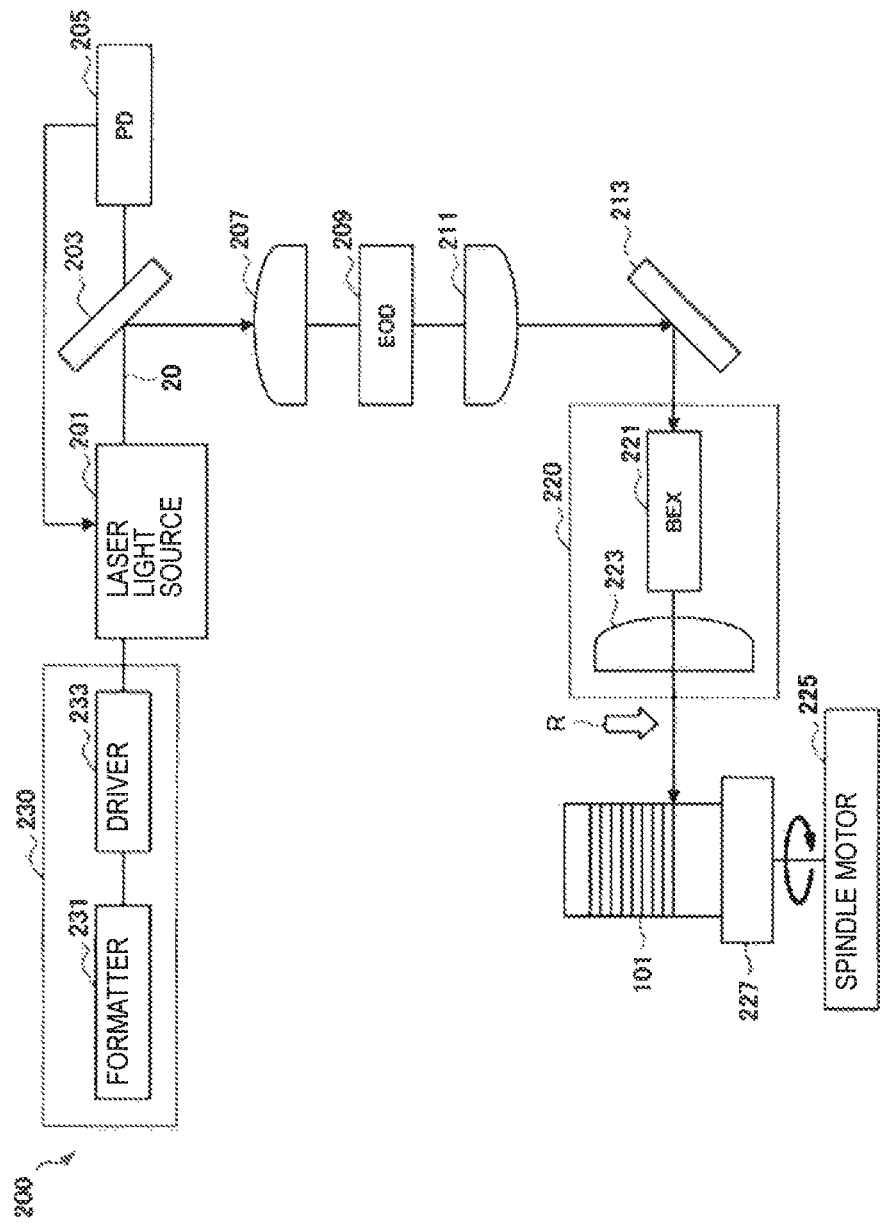
FIG. 11 is an explanatory diagram explaining an exposure device used when exposing a hollow round cylindrical master according to the embodiment.

As illustrated in FIG. 11, the exposure device 200 is provided with a laser light source 201, a first mirror 203, a photodiode (PD) 205, a condenser lens 207, an electro-optic deflector (EOD) 209, a collimator lens 211, a control mechanism 230, a second mirror 213, a movable optical table 220, a spindle motor 225, and a turntable 227. Also, the base material 101 is placed on the turntable 227.

The laser light source 201 is a light source that oscillates laser light 20 for exposing the base material resist layer 15 formed in a film on the outer circumferential surface of the base material 101, and is for example a semiconductor laser that emits laser light at a wavelength in the blue light band from 400 nm to 500 nm, for example. The laser light 20 emitted from the laser light source 201 advances directly in a collimated beam, and reflects off the first mirror 203. Also, the laser light 20 reflected by the first mirror 203 is condensed onto the electro-optic deflector 209 by the condenser lens 207, and then once again shaped into a collimated beam by the collimator lens 211. The laser light 20 shaped into a collimated beam is reflected by the second mirror 213, and guided horizontally over the movable optical table 220.

The first mirror 203 is made up of a polarizing beam splitter, and has a function of reflecting one polarized component, and transmitting the other polarized component. The polarized component that is transmitted through the first mirror 203 is photoelectrically converted by the photodiode 205, and the photoelectrically converted photodetection signal is input into the laser light source 201. With this arrangement, the laser light source 201 is able to modulate the laser light 20 on the basis of feedback provided by the input photodetection signal.

The electro-optic deflector 209 is an element capable of controlling the radiation position of the laser light 20. With the electro-optic deflector 209, the exposure device 200 is also able to vary the radiation position of the laser light 20 guided over the movable optical table 220.

The movable optical table 220 is provided with a beam expander (BEX) 221 and an objective lens 223. The laser light 20 guided to the movable optical table 220 is shaped into a desired beam shape by the beam expander 221, and then radiated via the objective lens 223 onto the base material resist layer 15 formed in a film on the outer circumferential surface of the base material 101.

At this point, the laser light 20 is moved in the axial direction of the base material 101 while rotating the base material 101 with the turntable 227 to intermittently radiate the laser light 20 onto the base material resist layer 15, and thereby expose the base material resist layer 15. Note that the movement of the laser light 20 is conducted by moving the movable optical table 220 in the direction of the arrow R.

Also, the exposure device 200 is provided with a control mechanism 230 for making the radiation positions by the laser light 20 form a two-dimensional pattern such as a rectangular lattice or a hexagonal lattice. The control mechanism 230 is provided with a formatter 231 and a driver 233, and controls the radiation of the laser light 20. The driver 233 controls the output of the laser light source 201 on the basis of a control signal generated by the formatter 231. With this arrangement, the irradiation of the base material resist layer 15 by the laser light 20 is controlled.

Note that the exposure device 200 synchronizes a control signal from the formatter 231 and a servo signal of the spindle motor 225 for each track, so that a two-dimensional pattern is synchronized with each track. Consequently, by setting factors such as the rotation rate of the turntable 227, the modulation frequency of the laser light 20, and the feed pitch of the movable optical table 220 to appropriate values, the exposure device 200 is able to expose an arbitrary periodic two-dimensional pattern with respect to the base material resist layer 15.

The base material 101 exposed by the exposure device 200, by being processed with known devices on the basis of the master manufacturing method described above, is manufactured as the hollow round cylindrical master 100. Also, by using a transfer device 300 described with reference to FIG. 12, the manufactured hollow round cylindrical master 100 is able to continuously manufacture an optical body to which is transferred the concave-convex structure 103 on the outer circumferential surface. FIG. 12 is an explanatory diagram explaining a transfer device that manufactures an optical body 4 using the hollow round cylindrical master 100 according to the present embodiment.

Figure 12:
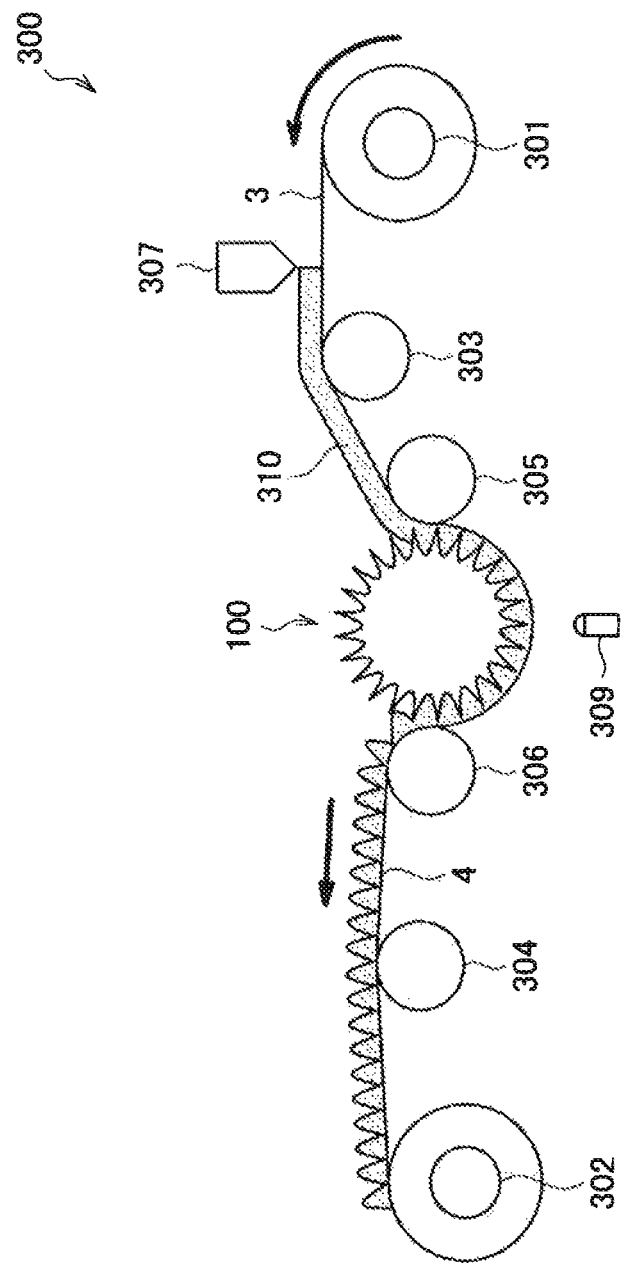
FIG. 12 is an explanatory diagram explaining a transfer device that manufactures an optical body using a hollow round cylindrical master according to the embodiment.

As illustrated in FIG. 12, the transfer device 300 is provided with the hollow round cylindrical master 100, a base material supply roll 301, a take-up roll 302, guide rolls 303 and 304, a nip roll 305, a separation roll 306, an applicator device 307, and a light source 309. In other words, the transfer device 300 illustrated in FIG. 12 is a roll-to-roll nanoimprint transfer device.

The base material supply roll 301 is a roll around which a sheet-like resin base material 3 is wound in a roll, while the take-up roll 302 is a roll that takes up an optical body 4 on which is laminated a resin layer 310 to which is transferred the concave-convex structure 103. Also, the guide rolls 303 and 304 are rolls that transport the resin base material 3 and the optical body 4. The nip roll 305 is a roll that presses the resin base material 3 on which is laminated the resin layer 310 onto the hollow round cylindrical master 100, while the separation roll 306 is a roll that separates the optical body 4 on which is laminated the resin layer 310 from the hollow round cylindrical master 100 after the concave-convex structure 103 is transferred to the resin layer 310.

The applicator device 307 is provided with an applicating means such as a coater, and applies a light-curing resin composition to the resin base material 3 to form the resin layer 310. The applicator device 307 may be a device such as a gravure coater, a wire bar coater, or a die coater, for example. Also, the light source 309 is a light source that emits light of a wavelength able to cure the light-curing resin composition, and may be a device such as an ultraviolet lamp, for example.

Note that the light-curing resin composition is a resin that is cured by being irradiated with light of a certain wavelength. Specifically, the light-curing resin composition may be an ultraviolet-curing resin such as acrylic resin acrylate or epoxy acrylate. Additionally, the light-curing resin composition may also include substances as necessary, such as an initiator, a filler, a functional additive, a solvent, an inorganic material, a pigment, an antistatic agent, or a sensitizing dye.

In the transfer device 300, first, the resin base material 3 is sent continuously from the base material supply roll 301 via the guide roll 303. The light-curing resin composition is applied by the applicator device 307 to the sent resin base material 3, and the resin layer 310 is laminated onto the resin base material 3. Also, the resin base material 3 on which is laminated the resin layer 310 is pressed onto the hollow round cylindrical master 100 by the nip roll 305. With this arrangement, the concave-convex structure 103 formed on the outer circumferential surface of the hollow round cylindrical master 100 is transferred to the resin layer 310. The resin layer 310 to which is transferred the concave-convex structure 103 is cured by being irradiated with light from the light source 309. Next, the optical body 4 on which is laminated the cured resin layer 310 is separated from the hollow round cylindrical master 100 by the separation roll 306, sent to the take-up roll 302 via the guide roll 304, and taken up.

By such a transfer device 300, the hollow round cylindrical master 100 according to the present embodiment is able to continuously manufacture an optical body to which is transferred the concave-convex structure 103 formed on the outer circumferential surface of the hollow round cylindrical master 100.

<3. Exemplary Applications of Optical Body>

Next, exemplary applications of the optical body 4 manufactured with the master 1 according to the present embodiment will be described with reference to FIGS. 13A and 13B.

One exemplary application of the optical body 4 according to the present embodiment is an anti-reflection film for a display device, display panel, or the like, for example. Specifically, the optical body 4 is laminated onto a display screen of a display device, display panel, or the like.

As described above, the optical body 4 according to the present embodiment is a resin film in which a periodic micro concave-convex structure having an average cycle of concavities and convexities that is less than or equal to the visible light wavelengths and a macro concave-convex structure having an average cycle of concavities and convexities that is greater than the visible light wavelengths are superimposed and formed. Also, the haze value of the optical body 4 preferably is 20% or greater, and more preferably 40% or greater. Hereinafter, the reasons why the optical body 4 according to the present embodiment is favorable as an anti-reflection film will be explained.

First, the optical body 4 has high anti-reflection characteristics by being provided on the surface with a periodic micro concave-convex structure having an average cycle of concavities and convexities that is less than or equal to the visible light wavelengths. Consequently, the optical body 4 is able to moderate reflections of incident light on a display screen, and thus improve the visibility of text and images displayed on display devices, display panels, and the like.

Second, the optical body 4 has high anti-glare characteristics by being provided on the surface with a macro concave-convex structure having an average cycle of concavities and convexities that is greater than the visible light wavelengths. Consequently, the optical body 4 is able to moderate glare from outside light on a display screen of a display device, display panel, or the like, and thus improve the visibility of displayed text and images.

Third, the optical body 4 preferably has a haze value (that is, scattering efficiency) of 20% or greater. By having a high scattering efficiency, the optical body 4 is able to moderate internally reflected light produced at the interface between the display device or display panel and the optical body 4, as well as internally reflected light from the display device or display panel. Also, under conditions in which internally reflected light is produced, the haze value of the optical body 4 is more preferably 40% or greater. Note that an upper limit on the haze value of the optical body 4 is not particularly decided, and may be 100%.

Hereinafter, the mechanism by which an optical body 4 with high scattering efficiency according to the present embodiment moderates internal reflections will be described with reference to FIGS. 13A and 13B. FIG. 13A is an explanatory diagram illustrating the path of incident light in a case of laminating onto an internal reflector 5 an optical body 4A with a lower scattering efficiency than the optical body 4 according to the present embodiment. Meanwhile, FIG. 13B is an explanatory diagram illustrating the path of incident light in a case of laminating onto an internal reflector 5 the optical body 4 according to the present embodiment. Note that the internal reflector 5 is a display device, a display panel, or the like, for example.

Figure 13A:
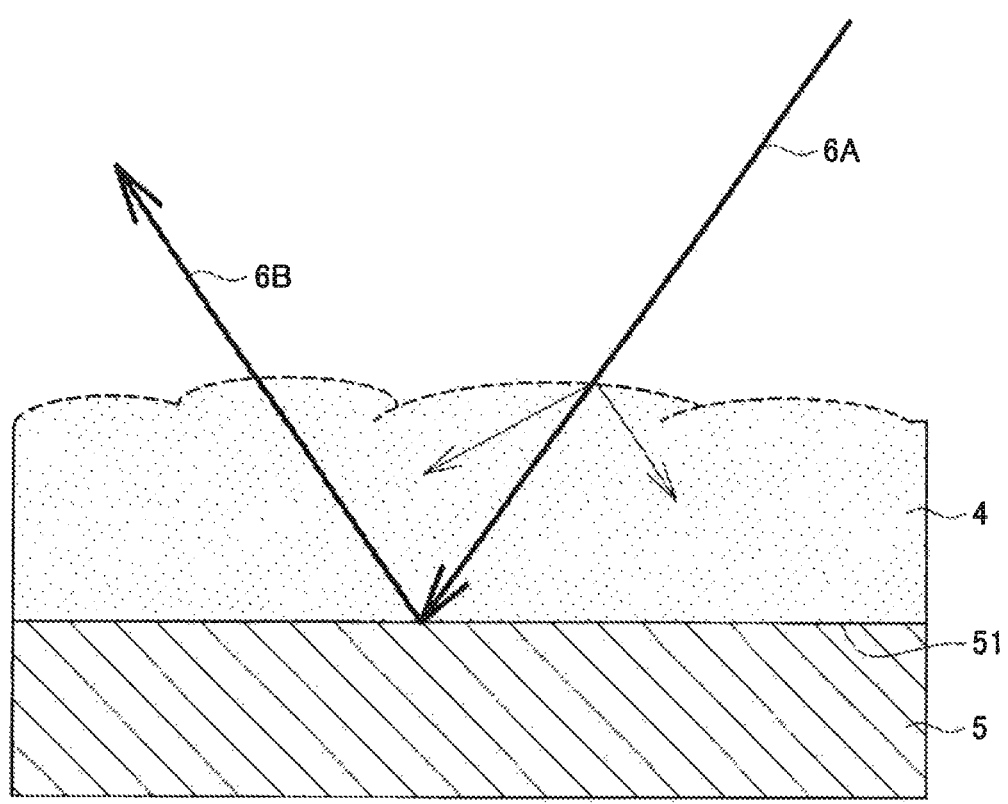
FIG. 13A is an explanatory diagram illustrating the path of incident light in a case of laminating onto an internal reflector an optical body with lower scattering efficiency than the present invention.

As illustrated in FIG. 13A, with the internal reflector 5 on which is laminated the optical body 4A, in a case in which strong incident light 6A is incident, since the scattering efficiency at the surface of the optical body 4A is low, part of the incident light 6A reaches the internal reflector 5. At this point, since reflections are produced at the interface between members with different refractive indices, part of the incident light 6A is reflected at the interface 51 between the optical body 4A and the internal reflector 5, producing specular light 6B. Consequently, with the internal reflector 5 on which is laminated the optical body 4A having a lower scattering efficiency than the optical body 4 according to the present embodiment, since internal reflections are not moderated adequately, glare from outside light cannot be moderated adequately.

Figure 13B:
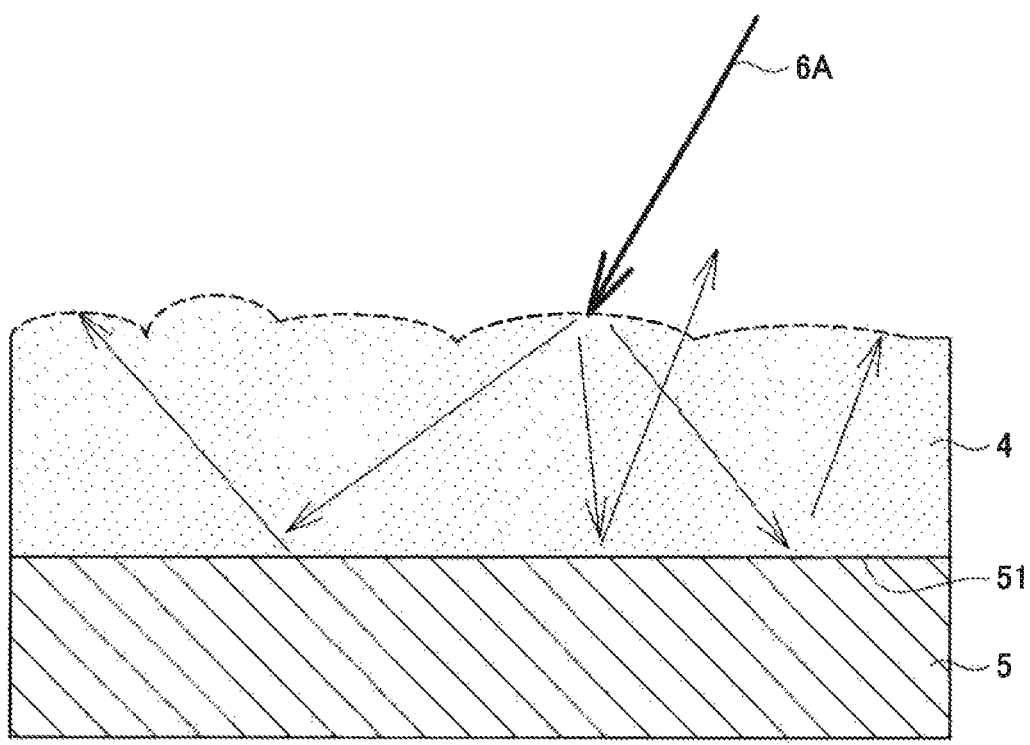
FIG. 13B is an explanatory diagram illustrating the path of incident light in a case of laminating onto an internal reflector an optical body according to the present invention.

On the other hand, as illustrated in FIG. 13B, with the internal reflector 5 on which is laminated the optical body 4 according to the present embodiment, in the case in which strong incident light 6A is incident, since the scattering efficiency at the surface of the optical body 4 is high, almost all of the incident light 6A can be scattered. With this arrangement, in the optical body 4, since the incident light 6A that reaches the internal reflector 5 is greatly reduced, there is produced almost no specular light 6B reflecting off the interface 51 between the optical body 4A and the internal reflector 5. Consequently, with the internal reflector 5 on which is laminated the optical body 4 according to the present embodiment, glare from outside light can be moderated adequately.

Note that the effect of moderating internal reflections by such an optical body 4 is exhibited more effectively in a liquid crystal display device in which many layers of members with difference refractive indices are laminated together. Also, such an optical body 4 can be applied more effectively to an in-vehicle display device or a display panel, on which strong outside light is incident and for which there is strong demand to reduce glare from such outside light on the display screen.

The foregoing thus describes in detail a master according to the present embodiment and an optical body manufactured with the master.

EXAMPLES

<4. Examples

Hereinafter, the master according to the present embodiment will be described more specifically with reference to examples and comparative examples. Note that the examples indicated below are conditional examples for indicating the embodiment possibilities and advantageous effects of the master and the manufacturing method thereof according to the present embodiment, and a master and a manufacturing method thereof according to the present invention are not limited to the examples below.

[4.1. Evaluation of Macro Concave-Convex Structure in Organic Resist Layer]

First, an evaluation sample was produced by spraying the novolac resin P4210 (by AZ Chemical Inc.) diluted with a diluent onto a quartz substrate by spray coating, and the film formation of an organic resist layer provided with a macro concave-convex structure was confirmed.

Test Example 1

The diluent was prepared by mixing acetone and propylene glycol monomethyl ether acetate (PGMAC) in a 1:1 mass ratio, and this diluent was used to dilute the P4210 (organic resist) to 1:20 by mass ratio. By spraying the dilute P4210 onto the quartz substrate so as to be microparticulated by a needle-type spray coater, an organic resist layer was formed in a film, and an evaluation sample was produced. Note that in the above, the acetone corresponds to a solvent that volatilizes during spraying.

Test Example 2

An organic resist layer was formed in a film on a quartz substrate similarly to Test Example 1, except that a diluent obtained by mixing acetone and PGMAC in a 3:1 mass ratio was prepared, and an evaluation sample was produced.

Test Example 3

An organic resist layer was formed in a film on a quartz substrate similarly to Test Example 1, except that acetone only was used as the diluent, and an evaluation sample was produced.

Test Example 4

An organic resist layer was formed in a film on a quartz substrate similarly to Test Example 3, except that the dilution ratio of the P4210 (organic resist) by the diluent was set to 1:10 by mass ratio, and an evaluation sample was produced.

(Evaluation Results of Macro Concave-Convex Structure)

Figure 14:
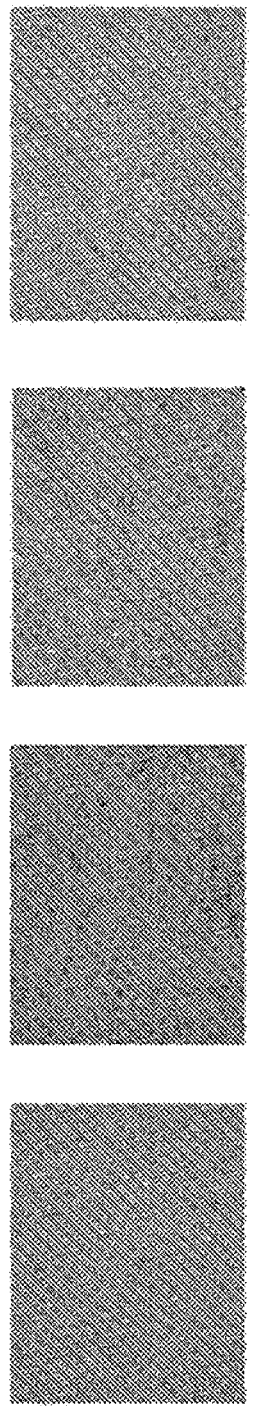
FIG. 14 is images, observed with an optical microscope, of evaluation samples according to Test Examples 1 to 4.

The evaluation samples according to Test Examples 1 to 4 produced as above were observed with an optical microscope at 50×, in which the microparticulation and piling of the organic resist on the quartz substrate were confirmed. Images representing the observation results are illustrated in FIG. 14. FIG. 14 is images, observed with an optical microscope, of the evaluation samples according to Test Examples 1 to 4.

As illustrated in FIG. 14, the surface of the organic resist layer in Test Examples 1 to 4 is shown to have microparticle-shaped concavities and convexities in all cases. Consequently, Test Examples 1 to 4 demonstrate that the sprayed organic resist is first microparticulated and then piled onto the quartz substrate.

Also, the surface shapes of the evaluation samples according to Test Examples 1 to 3 were measured by being scanned using the Surfcorder ET200 (by Kosaka Laboratory Ltd.) at a measurement speed of 100 μm/s and a measurement force of 100 μN. With this arrangement, the shape of the macro concave-convex structure formed on the surface of the organic resist layer formed in a film was confirmed. The measurement results of the surface shape of the organic resist layer are indicated in Table 1. Note that Ra (the arithmetic average roughness) and Rz (the ten-point mean roughness) are the results measured by scanning 1000 μm. Also, the convexity width is the result of measuring the width between the base points of adjacent valleys in the macro concave-convex structure.

TABLE 1

|  | Test Example 1 | Test Example 2 | Test Example 3 |
| --- | --- | --- | --- |
| Ra [μm] | 0.194 | 0.183 | 0.284 |
| Rz [μm] | 1.35 | 1.19 | 2.18 |
| Convexity width [μm] | Approx. 40 | Approx. 10 to 20 | Approx. 5 to 10 |

Referring to the results in Table 1, it is demonstrated that a macro concave-convex structure in which the average cycle of concavities and convexities is greater than the visible light wavelengths is formed on the surface of the organic resist layer according to Test Examples 1 to 3. Also, it is demonstrated that the height difference between vertices of the peaks and base points of the valleys in the macro concave-convex structure formed on the surface of the organic resist layer according to Test Examples 1 to 3 is approximately 2 μm or greater.

Consequently, by the organic resist layer formation method according to the present embodiment, it is demonstrated that it is possible to form on a substrate an organic resist layer having on the surface a macro concave-convex structure in which the average cycle of concavities and convexities is greater than the visible light wavelengths.

[4.2. Evaluation of Master]

Next, by the following steps, a master according to the present embodiment was manufactured, and the manufactured master was used to manufacture an optical body.

Example 1

First, on the outer circumferential surface of a hollow round cylindrical base material made of quartz glass (axial length 480 mm×outer diameter 132 mm), a base material resist layer was formed by sputtering in a film approximately 50 nm to 60 nm thick, using a material including tungsten oxide. Next, thermal reaction lithography by laser light was conducted with the exposure device 200 illustrated in FIG. 11, and a latent image of a hexagonal lattice dot array pattern (micro concave-convex structure) was formed on the base material resist layer.

Note that the exposed dot array pattern is a hexagonal lattice arrangement following the circumferential direction of the base material, in which round dots are arranged in rows (tracks) at a pitch of approximately 230 nm, with a spacing of approximately 150 nm between adjacent tracks. Note that adjacent tracks are offset from each other by one-half the pitch.

Next, by performing a development process on the base material using NMD-3 (2.38% by mass aqueous solution of tetramethylammonium hydroxide) (by Tokyo Ohka Kogyo Co., Ltd.), the exposed portion of the base material resist was dissolved to form a dot array-shaped micro concave-convex structure in the base material resist layer.

Next, an inorganic resist layer made of $SiO_2$ was formed in a film 1000 nm thick on the base material resist layer in which is formed the dot array-shaped micro concave-convex structure. Note that the inorganic resist layer was formed in a film by an oxygen-added sputter using a Si target.

Next, a solution in which the novolac resin P4210 (by AZ Chemical Inc.) is diluted to 1:20 by mass ratio with a diluent made of acetone only was used to microparticulate and spray the P4210 onto the inorganic resist layer by spray coating. Hence, an organic resist layer provided with a macro concave-convex structure was formed in a film on the inorganic resist layer.

Next, with the organic resist layer as a mask, $CHF_3$ gas (30 sccm) and $CF_4$ gas (30 sccm) were used to etch the inorganic resist layer for 30 min at a gas pressure of 0.5 Pa and an input power of 200 W. Next, with the inorganic resist layer and the base material resist layer as a mask, $CHF_3$ gas (30 sccm) was used to etch the base material for 60 min to 120 min at a gas pressure of 0.5 Pa and an input power of 200 W.

By the above steps, a master was manufactured, in which are superimposed and formed a micro concave-convex structure formed in the base material resist layer, and a macro concave-convex structure formed in the organic resist layer.

Also, the master manufactured as above was used to manufacture an optical body. Specifically, with the transfer device 300 illustrated in FIG. 12, the micro concave-convex structure and the macro concave-convex structure superimposed and formed on the outer circumferential surface of the master were transferred to an ultraviolet-curing resin, and an optical body according to Example 1 was manufactured. Note that polyethylene terephthalate was used for the resin base material of the optical body. Also, the ultraviolet-curing resin was cured by being irradiated for 1 min with ultraviolet rays at 1000 $mJ/cm^2$ from a metal halide lamp.

Comparative Example 1

An inorganic resist layer was formed in a film by a method similar to Example 1, but an organic resist layer was not formed in a film on the inorganic resist layer, and with the inorganic resist layer and the base material resist layer as a mask, $CH_3$ gas (30 sccm) was used to etch the base material for 60 min at a gas pressure of 0.5 Pa and an input power of 200 W. By the above steps, a master in which is formed only a micro concave-convex structure was manufactured. Also, the master according to Comparative Example 1 manufactured as above was used to manufacture an optical body in which is formed only a micro concave-convex structure, by a method similar to Example 1.

(Evaluation Results)

By evaluating the optical body to which is transferred the concave-convex structure formed in the master, the concave-convex structure formed in the master according to Example 1 was evaluated.

Figure 15A:
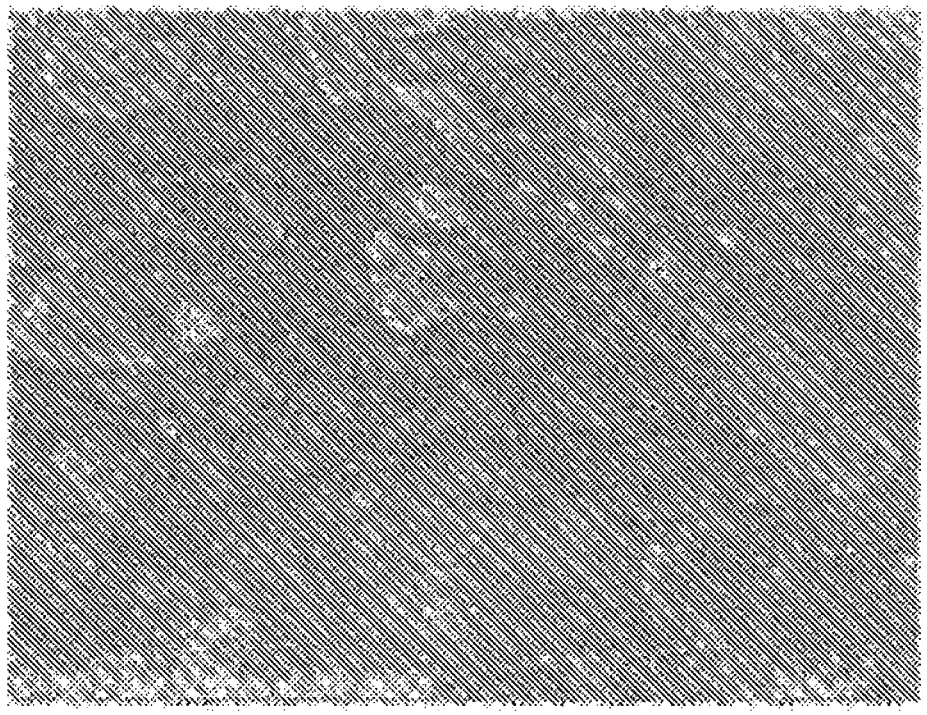
FIG. 15A is a 5000× SEM image observing the surface of an optical body according to Example 1.
Figure 15B:
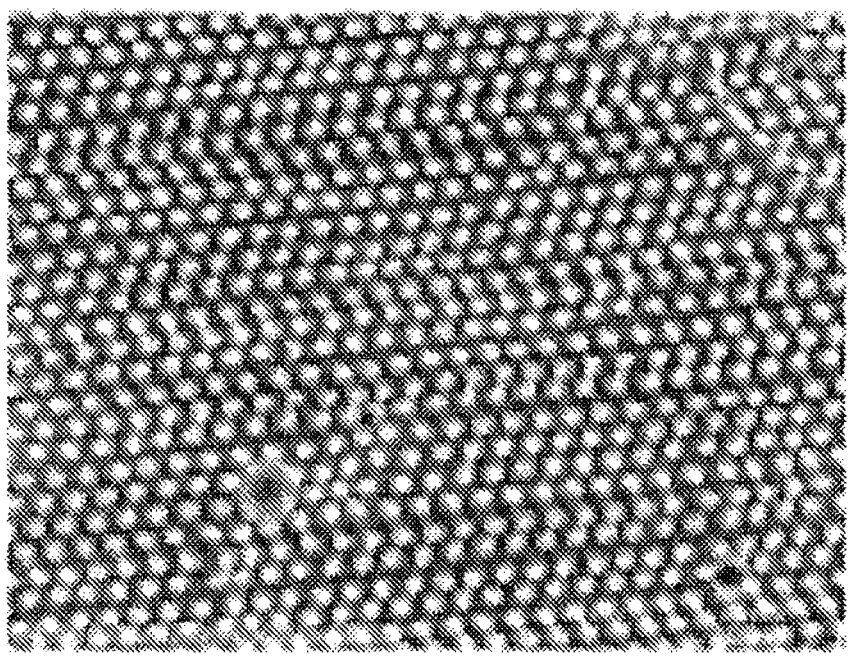
FIG. 15B is a 20000× SEM image observing the surface of an optical body according to Example 1.

First, a scanning electron microscope (SEM) was used to observe the concave-convex structure formed in the optical body according to Example 1. The results are illustrated in FIGS. 15A and 15B. FIGS. 15A and 15B are SEM images observing the surface of the optical body according to Example 1, in which FIG. 15A is an SEM image at 5000× magnification, and FIG. 15B is an SEM image at 20000× magnification.

Referring to FIG. 15A, it is demonstrated that a macro concave-convex to structure on the micrometer scale has been formed on the surface of the optical body according to Example 1. Also, referring to the higher-magnification FIG. 15B, it is demonstrated that a micro concave-convex structure having the periodicity of a hexagonal lattice has been formed on the surface of the optical body according to Example 1.

Next, specular reflection spectrometry and diffuse reflection spectrometry were performed on the optical body according to Example 1 and Comparative Example 1, and the anti-reflection characteristics of the optical bodies were evaluated.

Specifically, the specular reflection spectrum was measured by first irradiating the sample directly with light from a light source, and then condensing the reflected light from the sample with a spherical mirror, and guiding the condensed reflected light to an integrating sphere in which the light is homogenized by multiple reflection. Meanwhile, the diffuse spectrum was measured by first reflecting light from a light source with a spherical mirror, and then irradiating the sample provided inside an integrating sphere, and homogenizing the reflected light from the sample by multiple reflection inside the integrating sphere.

FIGS. 16A and 16B illustrate the results of specular reflection spectrometry and diffuse reflection spectrometry for the optical bodies according to Example 1 and Comparative Example 1. Note that the V-550 spectrophotometer (by JASCO Corporation) and the absolute reflectance measuring unit ARV474S (by JASCO Corporation) were used for each of the reflectance measurements. FIG. 16A is a graph illustrating the results of the specular reflection spectrometry for the optical bodies according to Example 1 and Comparative Example 1, while FIG. 16B is a graph illustrating the results of the diffuse reflection spectrometry for the optical bodies according to Example 1 and Comparative Example 1.

As illustrated in FIG. 16A, for the optical body according to Example 1, the to reflectance of the specular reflection spectrum is lower than the optical body according to Comparative Example 1 at all visible light wavelengths, thereby demonstrating that specular reflection can be moderated effectively. Also, as illustrated in FIG. 16B, for the optical body according to Example 1, the reflectance of the diffuse reflection spectrum is low to approximately the same degree as Comparative Example 1 at all visible light wavelengths, thereby demonstrating that diffuse reflection can be moderated.

Furthermore, the color tone of specular light for the optical bodies according to Example 1 and Comparative Example 1 was measured, and the luminous reflectance (Y) and the reflection chromaticity (a*, b*) were computed. Herein, the luminous reflectance of specular light (also called the spectral regular luminous reflectance) is the Y value from among (Y, x, y) when the colors of specular light are expressed in the Yxy color coordinate system, and represents the color lightness of the specular light. Meanwhile, the reflection chromaticity (a*, b*) represents the color tone of the specular light. In other words, as the luminous reflectance (Y) becomes lower, the lightness of the specular light becomes low, indicating that specular reflection is being moderated.

The measurement results for the color tone of specular light for the optical bodies according to Example 1 and Comparative Example 1 are indicated in Table 2 below. To measure the color tone of specular light, the Haze Meter HM-150 (by Murakami Color Research Laboratory Co., Ltd.) was used.

TABLE 2

|  | Y | x | y | a* | b* |
| --- | --- | --- | --- | --- | --- |
| Example 1 | 0.07 | 0.388 | 0.39 | 0.14 | 0.54 |
| Comparative Example 1 | 0.23 | 0.305 | 0.335 | −0.38 | 0.05 |

Referring to the results in Table 2, it is demonstrated that the optical body according to Example 1 has lower luminous reflectance (Y) and lower color lightness of specular light compared to the optical body according to Comparative Example 1. In other words, it is demonstrated that the optical body according to Example 1 has a higher capability of moderating specular reflection than the optical body according to Comparative Example 1.

The above results demonstrate that an optical body manufactured using the master according to Example 1 is provided with a periodic micro concave-convex structure having an average cycle of concavities and convexities that is less than or equal to the visible light wavelengths and a macro concave-convex structure having an average cycle of concavities and convexities that is greater than the visible light wavelengths, and has favorable anti-reflection characteristics and anti-glare characteristics.

[4.3. Evaluation of Uniformity of Master]

Next, the uniformity of the master according to Example 1 was evaluated. Specifically, in the master according to Example 1, the gloss, haze value, and diffuse spectral reflectance of a manufactured optical body were measured at respective distances (25 mm, 250 mm, and 475 mm) from one end in the axial direction. With this arrangement, axial direction variations in the concave-convex structure of the master were evaluated.

At this point, since the length in the axial direction of the master according to Example 1 is 480 mm, the positions at the distances of 25 mm and 475 mm from one end of the master mean the parts on either end of the master. Meanwhile, the position at the distance of 250 mm from one end of the master means the central part of the master.

First, the measurement results for the gloss and the haze value are indicated in Table 3. To measure the gloss and the haze value, the Haze Meter HM-150 (by Murakami Color Research Laboratory Co., Ltd.) was used. Also, the gloss is the reflectance at a light-receiving angle of 20° in the case of radiating light onto the optical body surface at a 20° angle of incidence (in other words, the 20° gloss).

TABLE 3

| | Distance from one end of master | | |
|---|---|---|---|
| | 25 mm | 250 mm | 475 mm |
| Gloss [%] | 0.3 | 0.4 | 0.3 |
| Haze value [%] | 28.9 | 25 | 30 |

Referring to the results in Table 3, it is demonstrated that optical bodies according to Example 1 have comparable haze values and comparably low gloss, regardless of which position on the master is used to manufacture the optical body. Consequently, it is demonstrated that optical bodies according to Example 1 have similarly high light-scattering properties and high anti-glare characteristics, regardless of which position on the master is used to manufacture the optical body. In other words, since optical bodies manufactured at different positions on the master have nearly the same anti-glare characteristics, it is demonstrated that in the master according to Example 1, a macro concave-convex structure having high uniformity in the axial direction is formed.

Also, the measurement of the diffuse spectral reflectance is illustrated in FIG. 17. FIG. 17 is a graph illustrating the results of diffuse reflection spectrometry of optical bodies manufactured at different positions on the master according to Example 1.

As illustrated in FIG. 17, it is demonstrated that optical bodies manufactured at positions 25 mm, 250 mm, and 475 mm away from one end of the master all have low reflectance of the diffuse reflection spectrum throughout the visible light wavelengths, and in addition, have nearly equal reflectance of the diffuse reflection spectrum. Consequently, since even optical bodies manufactured at different positions on the master have equally high anti-reflection characteristics, it is demonstrated that in the master according to Example 1, a uniform micro concave-convex structure is formed in the axial direction.

[4.4. Exemplary Application of Optical Body According to Present Embodiment]

Figure 18:
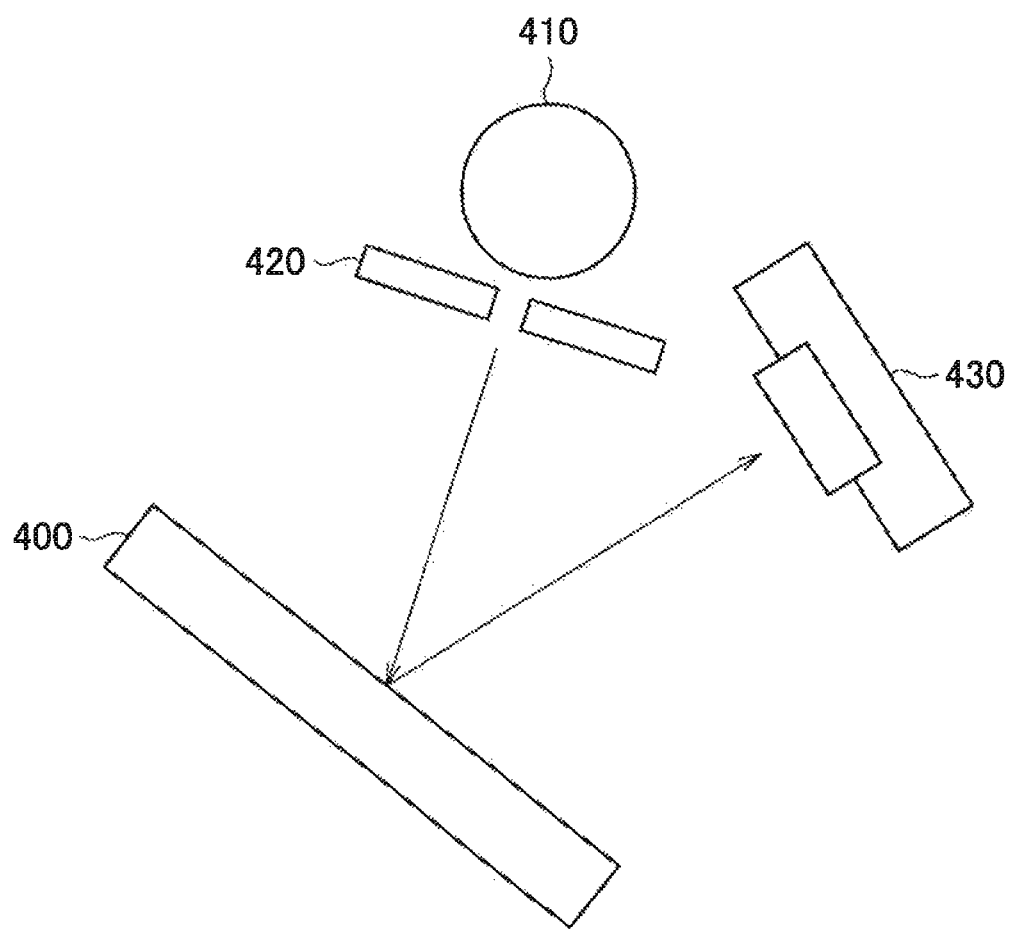
FIG. 18 is an explanatory diagram explaining a method of evaluating the anti-glare properties of a display device or a display panel in which an optical body has been applied to the display screen.

Next, FIGS. 18 to 20 will be referenced to describe the evaluation results in the case of applying an optical body according to the present embodiment as an anti-reflection film. Specifically, in the case of applying an optical body according to the present embodiment to a display device or a display panel, it was evaluated whether or not glare from outside light on the display screen can be prevented.

First, optical bodies were manufactured under the following conditions, and applied to a display device or display panel to create examples and comparative examples.

Note that the iPod Touch (registered trademark) was used as a display device. Also, a panel obtained by applying a polyethylene terephthalate (PET) film printed black onto a polycarbonate (PC) panel 2.0 mm thick via an optical adhesive sheet (PD-S1 by PANAC Co., Ltd.) was used as a display panel.

Example 2

An optical body was manufactured similarly to Example 1, except that tungsten oxide was used for an inorganic resist layer, and after forming an organic resist layer by spraying, $CF_4$ gas (30 sccm) was used to etch the inorganic resist layer for 30 min at a gas pressure of 0.5 Pa and an input power of 200 W. The manufactured optical body was applied to a display device or a display panel via an optical adhesive sheet (PD-S1 by PANAC Co., Ltd.).

Example 3

After forming an organic resist layer by spraying, $CHF_3$ gas (15 sccm) and $CF_4$ gas (15 sccm) were used to etch the inorganic resist layer for 20 min at a gas pressure of 0.5 Pa and an input power of 200 W. An optical body was manufactured similarly to Example 1, except that the above formation of the organic resist layer and etching of the inorganic resist layer was treated as one cycle, and this cycle was repeated for seven cycles. The manufactured optical body was applied to a display device or a display panel via an optical adhesive sheet (PD-S1 by PANAC Co., Ltd.).

Example 4

An optical body was manufactured similarly to Example 3, except that the above cycle made up of the formation of the organic resist layer and the etching of the inorganic resist layer was repeated three times. The manufactured optical body was applied to a display device or a display panel via an optical adhesive sheet (PD-S1 by PANAC Co., Ltd.).

Example 5

The optical body according to Example 4 was applied to a display device or a display panel using a high-haze adhesive (prototype) with a haze value of 45%.

Comparative Example 2

Polyethylene terephthalate was used for the base material, and an antiglare (AG) layer with a haze value of 18% was laminated onto one face of the base material by wet coating. On top of the AG layer, a multi-layer thin film of $SiO_x$ (film thickness 3 nm), $Nb_2O_5$ (film thickness 20 nm), $SiO_2$ (film thickness 35 nm), $Nb_2O_5$ (film thickness 35 nm), and $SiO_2$ (film thickness 100 nm) in that order was formed in a film by sputtering to form an anti-reflection layer. By the above steps, an optical body was manufactured. The manufactured optical body was applied to a display device or a display panel via an optical adhesive sheet (PD-S1 by PANAC Co., Ltd.).

Comparative Example 3

Cellulose triacetate (TAC) film was used for the base material, and an AG hard coat layer with a haze value of 9% was laminated onto one face of the base material by wet coating. Next, on top of the AG hard coat layer, a resin layer having a lower refractive index than the AG hard coat layer and including filler was laminated by wet coating to form an anti-reflection layer. By the above steps, an optical body was manufactured. The manufactured optical body was applied to a display device or a display panel via an optical adhesive sheet (PD-S1 by PANAC Co., Ltd.).

Comparative Example 4

In Example 1, after the development process for the base material resist layer, the base material resist layer was used as a mask to etch the base material using $CHF_3$ gas, and manufacture a master in which a micro concave-convex structure is formed on the outer circumferential surface of the base material. Other than using such a master in which is formed a micro concave-convex structure only, an optical body was manufactured by a method similar to Example 2. The manufactured optical body was applied to a display device or a display panel via an optical adhesive sheet (PD-S1 by PANAC Co., Ltd.).

Comparative Example 5

A commercially available anti-glare film for displays was purchased, in which an anti-glare layer with a haze value of approximately 23% and a hard coat layer are laminated onto a polyethylene terephthalate film. The purchased anti-glare film was applied to a display device or a display panel via an optical adhesive sheet (PD-S1 by PANAC Co., Ltd.).

(Evaluation Method)

First, various optical characteristics of the optical bodies according to Examples 2 to 5 and Comparative Examples 2 to 5 in isolation were evaluated.

As the various optical characteristics of the optical bodies in isolation, the luminous reflectance (Y), the reflection chromaticity (a*, b*), the gloss (20°, 60°, 75°), the total light transmittance, and the haze value were measured. To evaluate these characteristics, the Haze Meter HM-150 (by Murakami Color Research Laboratory Co., Ltd.) was used.

The evaluation results for the above optical bodies in isolation are indicated in Table 4.

TABLE 4

| | Optical body in isolation | | | | | | | |
|---|---|---|---|---|---|---|---|---|
| | Luminous reflectance | Reflection chromaticity | | Gloss | | | Total light transmittance | Haze value |
| | Y | a* | b* | 20° | 60° | 75° | [%] | [%] |
| Example 2 | 0.03 | −0.02 | 0.04 | 0.05 | 0.07 | 0.45 | 93.4 | 74.1 |
| Example 3 | 0.08 | 0.04 | 0.16 | 0.07 | 0.14 | 0.58 | 92.8 | 43.4 |
| Example 4 | 0.05 | −0.14 | −0.21 | 0.04 | 0.24 | 1.28 | 93.3 | 13.8 |
| Example 5 | 0.06 | −0.15 | −0.10 | 0.05 | 0.31 | 1.29 | 92.4 | 60.6 |
| Comparative Example 2 | 0.31 | 6.01 | −15.37 | 0.28 | 3.47 | 3.47 | 94.5 | 18.1 |
| Comparative Example 3 | 1.36 | 1.73 | −3.99 | 1.03 | 4.37 | 2.96 | 94.3 | 9.0 |
| Comparative Example 4 | 0.31 | −0.26 | −0.39 | 0.78 | 2.58 | 2.72 | 95.3 | 0.5 |
| Comparative Example 5 | 1.25 | 0.27 | −0.5 | 1.53 | 4.49 | 2.63 | 89.4 | 23.0 |

Referring to the results in Table 4, it is demonstrated that the optical bodies according to Examples 2 to 5 have lower luminous reflectance (Y) and also lower gloss, and thus have higher anti-reflection characteristics, than the optical bodies according to Comparative Examples 2 to 5. In addition, the optical bodies according to Examples 2 to 5 have a total light transmittance on par with Comparative Examples 2 to 5, thus demonstrating that both high anti-reflection characteristics and high transparency are achieved at the same time.

Next, for Examples 2 to 5 and Comparative Examples 2 to 5, it was evaluated whether or not glare from outside light is moderated on the display screen of a display device or a display panel to which the optical body is applied. Specifically, the luminous reflectance (Y) and anti-glare properties were evaluated for a display panel or a display device in which the optical body is applied to the display screen.

To measure the luminous reflectance (Y), the Haze Meter HM-150 (by Murakami Color Research Laboratory Co., Ltd.) was used.

Also, the anti-glare properties were evaluated with the method illustrated in FIG. 18. FIG. 18 is an explanatory diagram explaining a method of evaluating the anti-glare properties of a display panel or a display device in which an optical body has been applied to the display screen.

As illustrated in FIG. 18, the anti-glare properties were evaluated by shining the light of a fluorescent lamp 410 onto an evaluation sample 400 through a slit 420 having an opening 5 mm wide, and visually determining the degree of blurring of the reflected image of the fluorescent lamp 410. Additionally, the degree of blurring of the reflected image of the fluorescent lamp 410 was captured with an imaging device 430 to acquire a captured image.

To determine the degree of blurring, the following standard was used, in which 5 is favorable and 1 is unfavorable.

5: Outline of light from fluorescent lamp cannot be distinguished at all.

4: Outline of light from fluorescent lamp can be distinguished barely.

3: Light from fluorescent lamp is blurred, but outline can be distinguished mostly.

2: Light from fluorescent lamp is blurred very little, and outline can also be distinguished.

1: Light from fluorescent lamp is not blurred at all, and outline can also be distinguished clearly.

The evaluation results of a display panel or a display device in which an optical body has been applied to the display screen are indicated in Table 5. Also, images of the reflected images of the fluorescent lamp are illustrated in FIGS. 19 and 20. FIG. 19 is images of the reflected images of the light of the fluorescent lamp on a display panel to which is applied an optical body, while FIG. 20 is images of the reflected images of the light of the fluorescent lamp on a display device to which is applied an optical body. Note that in FIGS. 19 and 20, an image of the reflected image of the light of the fluorescent lamp on a display panel or a display device to which an optical body is not applied is also illustrated as a reference.

moderated on the optical body surface, internally reflected light is produced at the interface between the optical body and the display panel or the display device, and thus the light of the fluorescent lamp produces glare.

Also, in the optical body according to Comparative Example 5, since the haze value is high and the anti-glare characteristics are high, the outline of the light from the fluorescent lamp cannot be distinguished. However, in the optical body according to Comparative Example 5, since an anti-reflection layer is not formed and the anti-reflection characteristics are low, the light from the fluorescent lamp scatters, and the entire screen appears to have a whitish glow.

Also, in the optical bodies according to Comparative Examples 2 and 3, since the anti-glare characteristics are higher than Comparative Example 4 and an anti-reflection layer is also formed, glare from the light of the fluorescent lamp is moderated to the point where the outline can be distinguished barely. However, even though reflection on the optical body surface can be moderated, internally reflected light at the interface between the optical body and the display panel or the display device cannot be moderated, and thus glare from the light of the fluorescent lamp is produced.

On the other hand, since Examples 2 to 5 have high anti-reflection characteristics and high anti-glare characteristics, glare from the light of the fluorescent lamp is moderated significantly compared to Comparative Examples 2 to 5. Particularly, in Examples 2 and 3 in which the haze value of the optical body surface is 40% or greater, glare from the light of the fluorescent lamp is moderated to the point of not

TABLE 5

|  | Optical body in isolation | | Applied to display panel | | Applied to display device | |
| --- | --- | --- | --- | --- | --- | --- |
|  | Total light transmittance [%] | Haze value [%] | Luminous reflectance | Anti-glare properties | Luminous reflectance | Anti-glare properties |
| Example 2 | 93.4 | 74.1 | 0.04 | 5 | 0.08 | 5 |
| Example 3 | 92.8 | 43.4 | 0.27 | 5 | 0.47 | 5 |
| Example 4 | 93.3 | 13.8 | 0.19 | 3 | 0.51 | 3 |
| Example 5 | 92.4 | 60.6 | 0.12 | 4 | 0.47 | 4 |
| Comparative Example 2 | 94.5 | 18.1 | 0.49 | 4 | 0.97 | 4 |
| Comparative Example 3 | 94.3 | 9.0 | 2.18 | 4 | 2.09 | 4 |
| Comparative Example 4 | 95.3 | 0.5 | 0.59 | 2 | 1.24 | 2 |
| Comparative Example 5 | 89.4 | 23.0 | 1.45 | 5 | 2.2 | 5 |

Referring to the results of Table 5, the optical bodies according to Examples 2 to 5 have lower luminous reflectance than the optical bodies according to Comparative Examples 2 to 5, even in the case of being applied to a display panel or a display device, thereby demonstrating that reflections are moderated.

Also, referring to FIGS. 19 and 20, it is demonstrated that in the optical bodies according to Examples 2 to 5, glare from the light of a fluorescent lamp is moderated significantly compared to the optical bodies according to Comparative Examples 2 to 5.

Specifically, in the optical body according to Comparative Example 4, only a micro concave-convex structure is formed, and thus although the anti-reflection characteristics are high, the haze value is low, and the anti-glare characteristics are low. For this reason, in the case in which strong light is incident, for example, although reflections can be being visible. This is thought to be because incident light is scattered significantly at the optical body surface, and thus internally reflected light having enough light intensity to be visible is not produced.

Note that in Example 5, in which a haze (scattering) effect is conferred to the rear face of the light-incident face of the optical body by an adhesive, although the haze value for the optical body as a whole is higher than the optical body according to Example 3, glare from light due to internally reflected light could not be moderated more than Example 3. This is thought to indicate that to moderate the glare from light due to internally reflected light, the scattering properties on the light-incident surface of the optical body (in other words, the haze value of the light-incident surface) is particularly important.

The above results thus demonstrate that an optical body manufactured by a master according to the present embodiment can be used favorably as an anti-reflection film, and in particular, is able to significantly moderate glare from outside light in an environment irradiated with strong outside light.

The preferred embodiment(s) of the present invention has/have been described above with reference to the accompanying drawings, whilst the present invention is not limited to the above examples. A person skilled in the art may find various alterations and modifications within the scope of the appended claims, and it should be understood that they will naturally come under the technical scope of the present invention.

REFERENCE SIGNS LIST 1 master
11 base material
12 macro concave-convex structure
13 micro concave-convex structure
15 base material resist layer
17 inorganic resist layer
19 organic resist layer
121 peak
123 valley
131 convexity
133 concavity

The invention claimed is:

1. A master manufacturing method, comprising:
a step of forming, on a surface of a master body that includes a base material, a periodic micro concave-convex structure in which an average cycle of concavities and convexities is less than or equal to visible light wavelengths;
a step of forming an inorganic resist layer on the surface of the master body;
a step of microparticulating and spraying an organic resist dissolved in a diluent onto the inorganic resist layer, to thereby form an organic resist layer, on a surface of which is provided a macro concave-convex structure in which the average cycle of concavities and convexities is greater than the visible light wavelengths; and
a step of etching the organic resist layer, the inorganic resist layer, and the master body, to thereby superimpose and form the micro concave-convex structure and the macro concave-convex structure on the surface of the base material.

2. The master manufacturing method according to claim 1, wherein
the diluent includes a solvent that volatilizes during spraying.

3. The master manufacturing method according to claim 2, wherein
the solvent that volatilizes during spraying is included 50% by mass or greater with respect to a total mass of the diluent.

4. The master manufacturing method according to claim 1, wherein
an etching of the inorganic resist layer using the organic resist layer as a mask, and an etching of the base material using the inorganic resist layer as a mask, are conducted by dry etching using different gases.

5. The master manufacturing method according to claim 4, wherein
the dry etching is vertically anisotropic etching using a gas that at least includes fluorine atoms, and includes at least two or more from among carbon atoms, fluorine atoms, oxygen atoms, and hydrogen atoms.

6. The master manufacturing method according to claim 1, wherein
the micro concave-convex structure is formed by thermal reaction lithography with a laser.

7. The master manufacturing method according to claim 1, wherein
the master body is made up of the base material, and a base material resist layer formed on the surface of the base material,
the micro concave-convex structure is formed in the base material resist layer,
the inorganic resist layer is formed on the base material resist layer so as to embed the micro concave-convex structure, and
the base material resist layer is etched at a same time as the inorganic resist layer.

8. The master manufacturing method according to claim 7, wherein
an etch rate of the base material resist layer is different from an etch rate of the inorganic resist layer.

9. The master manufacturing method according to claim 1, wherein
the master body is made up of the base material, and
the micro concave-convex structure is formed in the base material.

10. An optical body,
in which the micro concave-convex structure and the macro concave-convex structure formed on the surface of the master is transferred to a resin base material, using the master manufactured by the manufacturing method according to claim 1.

11. The optical body according to claim 10, wherein a haze value is 20% or greater.

12. An optical member,
in which the optical body according to claim 10 is laminated onto a substrate surface.

13. A display device,
in which the optical body according to claim 10 is laminated onto a display screen.

* * * * *